US010083971B1

(12) United States Patent
Zang et al.

(10) Patent No.: US 10,083,971 B1
(45) Date of Patent: Sep. 25, 2018

(54) VERTICAL SRAM STRUCTURE WITH CROSS-COUPLING CONTACTS PENETRATING THROUGH COMMON GATES TO BOTTOM S/D METAL CONTACTS

(71) Applicant: GLOBALFOUNDRIES Inc., Grand Cayman (KY)

(72) Inventors: Hui Zang, Guilderland, NY (US); Manfred Eller, Beacon, NY (US); Kwan-Yong Lim, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/654,190

(22) Filed: Jul. 19, 2017

(51) Int. Cl.
*H01L 27/11* (2006.01)
*H01L 29/78* (2006.01)
*H01L 29/66* (2006.01)

(52) U.S. Cl.
CPC .... *H01L 27/1104* (2013.01); *H01L 29/66666* (2013.01); *H01L 29/785* (2013.01); *H01L 29/7827* (2013.01)

(58) Field of Classification Search
CPC .. H01L 27/11–27/1116; H01L 27/2454; H01L 2924/1437; H01L 29/7827;
(Continued)

(56) References Cited

U.S. PATENT DOCUMENTS 9,659,941 B2 * 5/2017 Anderson .......... H01L 27/1104
9,711,511 B1 * 7/2017 Lim .................. H01L 27/1104
(Continued)

OTHER PUBLICATIONS

U.S. Appl. No. 15/634,227, filed Jun. 27, 2017, titled Vertical SRAM Structure.

Primary Examiner — Marc Armand
Assistant Examiner — Younes Boulghassoul
(74) Attorney, Agent, or Firm — Heslin Rothenberg Farley & Mesiti P.C.; Stephen Scuderi

(57) ABSTRACT

A vertical SRAM cell includes a first ($1^{st}$) inverter having a $1^{st}$ common gate structure operatively connecting channels of a $1^{st}$ pull-up (PU) and a $1^{st}$ pull-down (PD) transistor. A $1^{st}$ metal contact electrically connects bottom source/drain (S/D) regions of the $1^{st}$ PU and $1^{st}$ PD transistors. A second ($2^{nd}$) inverter has a $2^{nd}$ common gate structure operatively connecting channels of a $2^{nd}$ PU and a $2^{nd}$ PD transistor. A $2^{nd}$ metal contact electrically connects bottom S/D regions of the $2^{nd}$ PU and $2^{nd}$ PD transistors. A $1^{st}$ cross-coupled contact electrically connects the $2^{nd}$ common gate structure to the $1^{st}$ metal contact. The $2^{nd}$ common gate structure entirely surrounds a perimeter of the $1^{st}$ cross-coupled contact. A $2^{nd}$ cross-coupled contact electrically connects the $1^{st}$ common gate structure to the $2^{nd}$ metal contact. The $1^{st}$ common gate structure entirely surrounds a perimeter of the $2^{nd}$ cross-coupled contact.

15 Claims, 21 Drawing Sheets

(58) Field of Classification Search
CPC ......... H01L 29/66666; H01L 29/41741; H01L 29/0676; H01L 21/823487
See application file for complete search history.

(56) References Cited

U.S. PATENT DOCUMENTS

| | | | |
|---|---|---|---|
| 9,761,662 B1* | 9/2017 | Paul | H01L 29/0692 |
| 2011/0018056 A1* | 1/2011 | Takeuchi | H01L 21/76895 257/329 |
| 2015/0179655 A1* | 6/2015 | Nakanishi | H01L 51/0575 257/9 |
| 2015/0318288 A1* | 11/2015 | Lim | H01L 27/1104 257/329 |
| 2015/0318290 A1* | 11/2015 | Liaw | H01L 27/1104 257/329 |
| 2016/0078922 A1* | 3/2016 | Liaw | H01L 29/66666 365/51 |
| 2018/0122793 A1* | 5/2018 | Moroz | H01L 27/0207 |

* cited by examiner

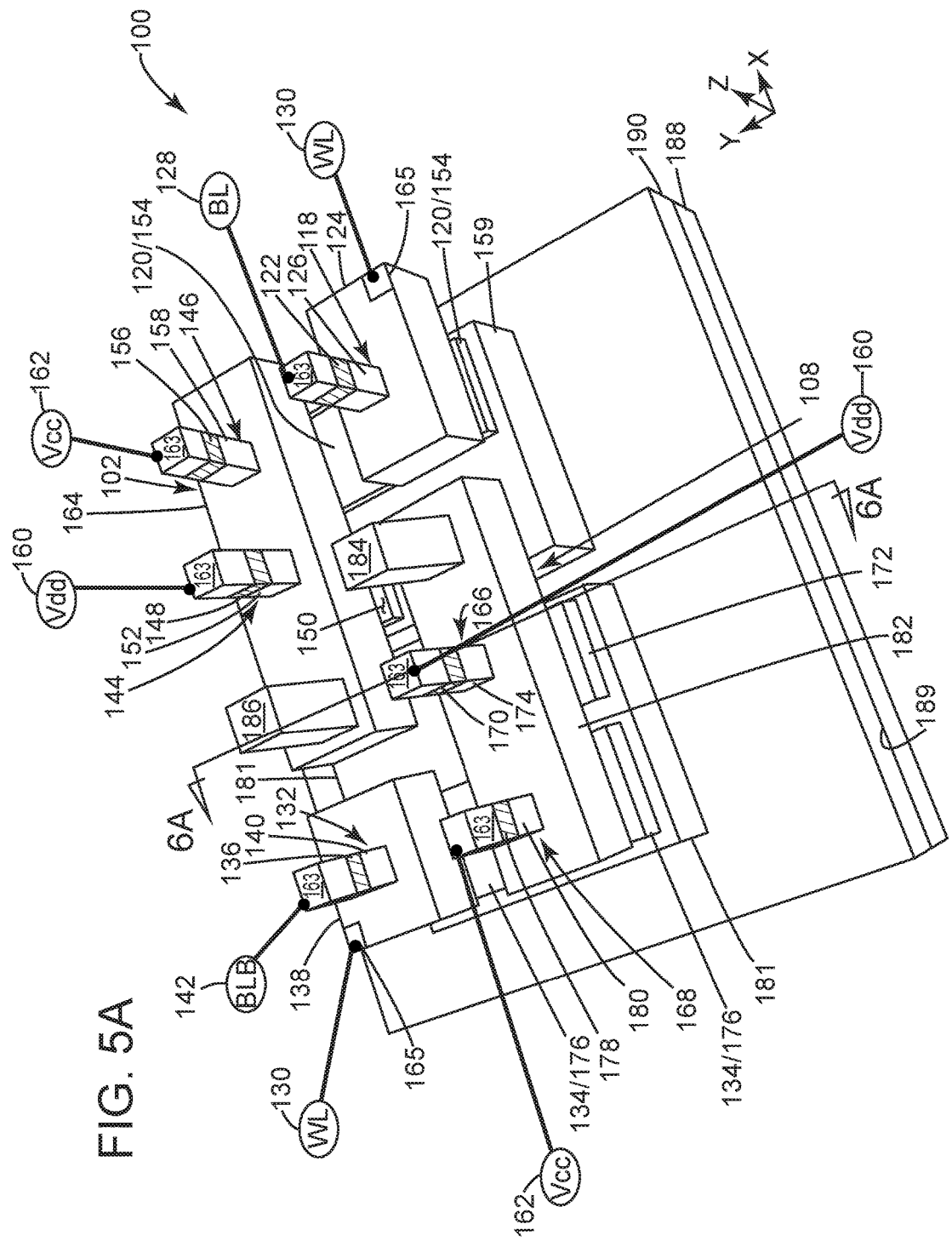

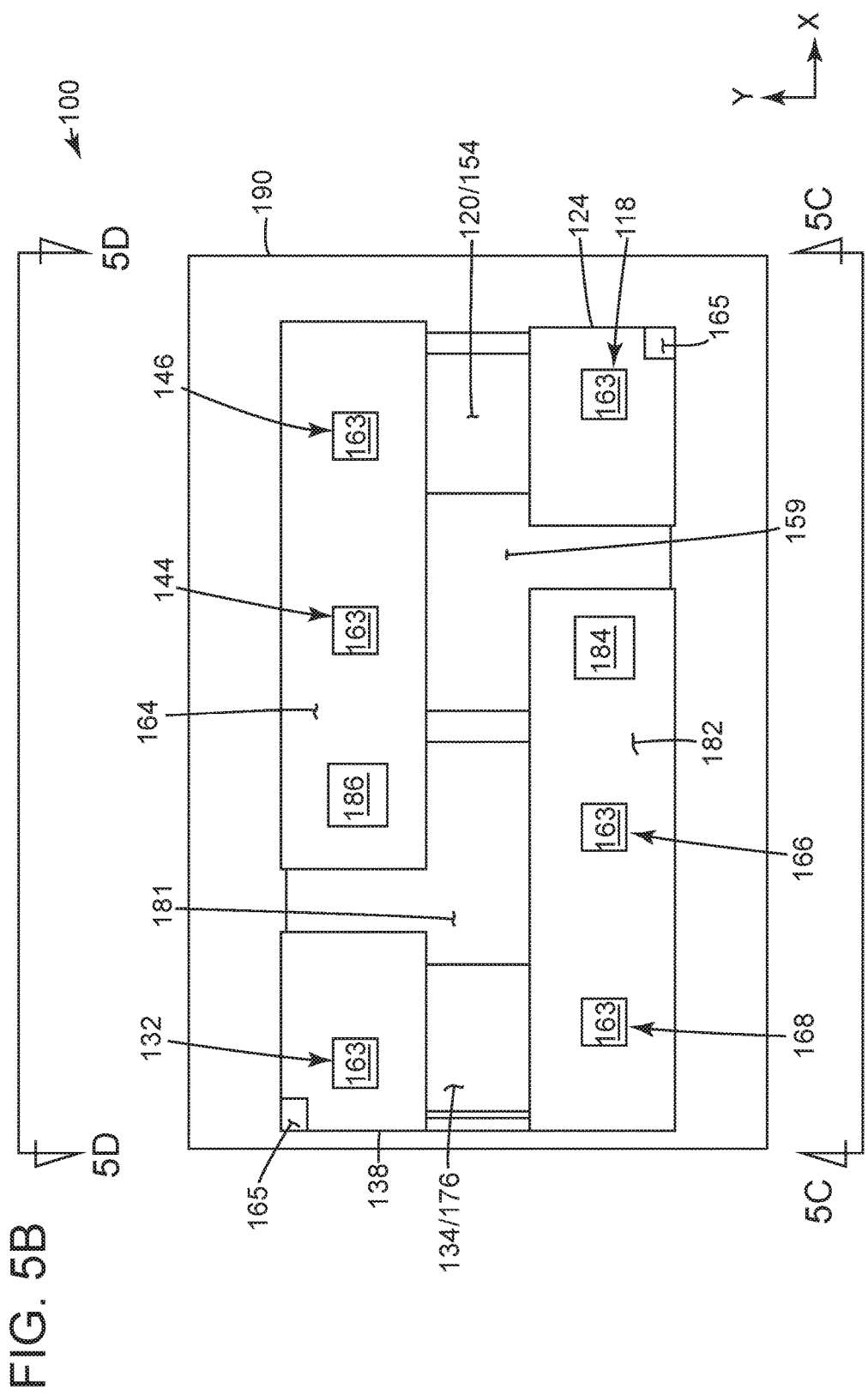

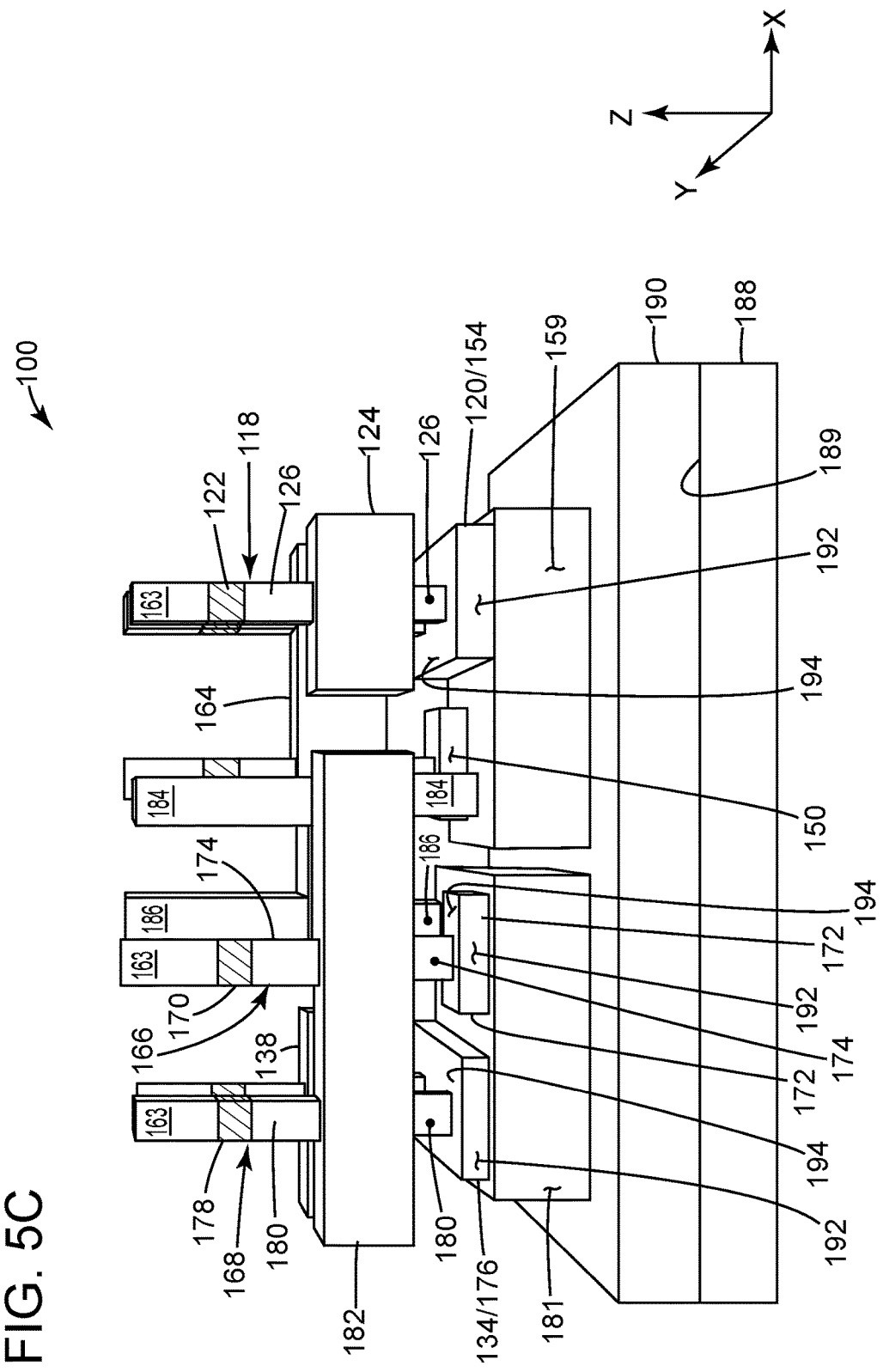

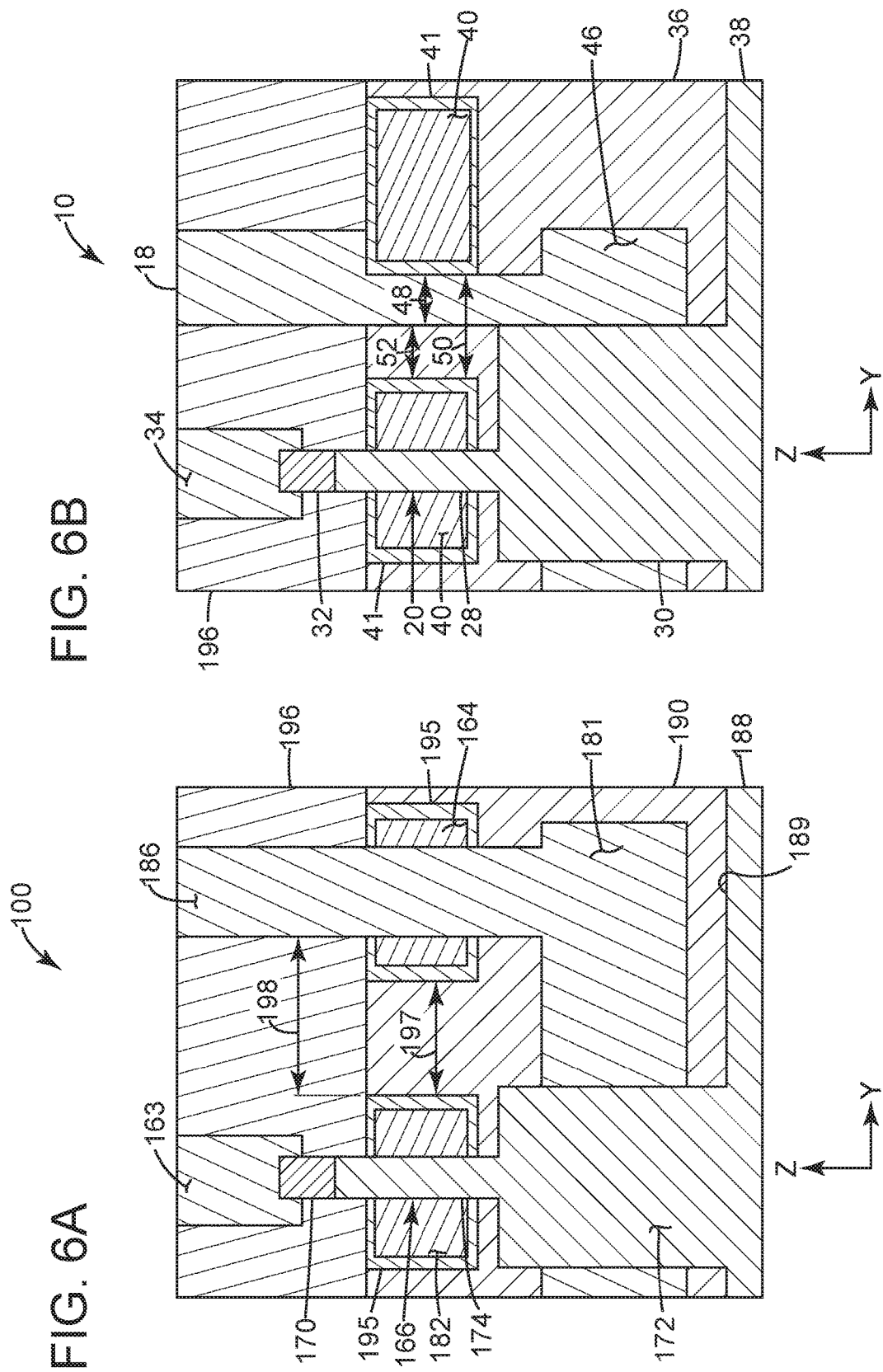

VERTICAL SRAM STRUCTURE WITH CROSS-COUPLING CONTACTS PENETRATING THROUGH COMMON GATES TO BOTTOM S/D METAL CONTACTS

TECHNICAL FIELD

The present invention relates to semiconductor devices and methods of making the same. More specifically, the invention relates to vertical Static Random Access Memory (SRAM) cell structures and methods of making the same.

BACKGROUND

SRAM cells (or SRAM cell structures) in general are random access memory cells that retain data bits in their memory as long as power is being supplied. SRAM is used in personal computers, workstations, routers, peripheral equipment and the like.

SRAM cells are composed of a pair of cross coupled inverters connected together by a pair of cross-coupled contacts to form first ($1^{st}$) and second ($2^{nd}$) storage node outputs with opposing logic states. Therefore SRAM cells have two stable logic states. The first logic state includes a logic one (1) and a logic zero (0) at the $1^{st}$ and $2^{nd}$ storage node outputs, respectively. The second logic state includes a logic 0 and a logic 1 at the same $1^{st}$ and $2^{nd}$ storage node outputs, respectively. The storage nodes will be connected to a pair of pass gate transistors, which are usually n-type transistors.

Typically each inverter includes a p-type pull-up (PU) transistor and an n-type pull-down (PD) transistor embedded in a substrate. The top surface of the substrate defines a substrate plane of the SRAM cell.

The PU and PD transistors of each inverter generally share a common gate structure. The common gate structure is operative to activate and deactivate the PU and PD transistors of each inverter simultaneously.

One source/drain (S/D) region of the PU transistor is connected to a voltage supply and the other S/D region is connected to a metal contact. One S/D region of the PD transistor is connected to a voltage ground and the other S/D region is connected to the same metal contact. The S/D regions that connect the PU and PD transistors of each inverter together are electrically connected together through the metal contact. This is because the p-type S/D region of the PU transistor and the n-type S/D region of the PD transistor cannot be connected directly together without forming an n-p junction. Therefore, to avoid the formation of such an n-p junction, the metal contact is utilized to provide electrical continuity between the S/D regions of the PU and PD transistors.

In order to cross-couple the first and second inverters, one cross-coupled contact of the SRAM cell electrically connects the common gate structure of the first inverter to the metal contact of the second inverter. Additionally the other cross-coupled contact of the SRAM cell electrically connects the common gate structure of the second inverter to the metal contact of the first inverter.

One of the pass gate transistors is connected to a bit line and the other to a bit line bar (herein collectively "the bit lines"). A word line enables the pass gate transistors to control data flow between the inverters and the bit lines during read and write operations.

SRAM cells are constantly being down-sized to meet increasingly demanding requirements to the speed and functionality of ultra-high density integrated circuits in semiconductor structures. As such, the transistors of the SRAM cells need to be ever more densely packaged within a given footprint of the substrate plane.

To overcome some of the technical challenges associated with down-sizing, prior art vertical SRAM cells using vertically extending transistors have been developed. These prior art vertical transistors have channels (such as a nanowire type channel, a fin type channel or the like) that extend vertically upwards from a bottom S/D region embedded in the substrate to an upper S/D region disposed above the substrate. A gate structure is disposed above the bottom S/D region and below the upper S/D region.

However, prior art cross-coupled contacts in prior art vertical SRAM cells extend around and between the edges and/or tips of the gate structures in order to be able to land on the metal contacts of the bottom S/D regions. The extension of the cross-coupled contacts between the gate structures increases the minimum distance between the gates structures relative to the substrate plane. Therefore, the overall minimum footprint that prior art vertical SRAM cells can be down-sized to is limited, at least in part, by the extension of the cross-coupled contacts between the gate structures.

Additionally, these prior art cross-coupled contacts physically abut the gate structures on only one side, rather than around the entire perimeter, of the cross-coupled contacts. This is because the opposing side of the cross-coupled contacts extend between the gate structures and over the metal contacts they must land on. As such, the area of contact between a prior art cross-coupled contact and the gate structure it connects to is limited to just one side of the abutting cross-coupled contact. This limited area of contact becomes increasingly problematic for the flow of electricity between inverters as the SRAM cells are increasingly down-sized.

Accordingly, there is a need for a vertical SRAM cell, and method of making the same, that includes cross-coupled contacts that do not extend between the gate structures and, therefore, do not limit the minimum distance between the gate structures. Additionally, there is a need to utilize the entire perimeter of the cross-coupled contact to make electrical contact with the gate structure.

BRIEF DESCRIPTION

The present invention offers advantages and alternatives over the prior art by providing a vertical SRAM cell structure, and method of making the same, having cross-coupled contacts that penetrate the gate structures of the SRAM cells and do not extend between the gate structures. As such, the cross-coupled contacts do not limit the minimum distance (or spacing) between the gate structures. Additionally, the entire perimeter of the cross-coupled contacts is utilized to make electrical contact with the gate structures of the vertical SRAM cells.

A vertical SRAM cell in accordance with one or more aspects of the present invention includes a first ($1^{st}$) inverter having a $1^{st}$ common gate structure operatively connecting channels of a $1^{st}$ pull-up (PU) and a $1^{st}$ pull-down (PD) transistor. A $1^{st}$ metal contact electrically connects bottom source/drain (S/D) regions of the $1^{st}$ PU and $1^{st}$ PD transistors. A second ($2^{nd}$) inverter has a $2^{nd}$ common gate structure operatively connecting channels of a $2^{nd}$ PU and a $2^{nd}$ PD transistor. A $2^{nd}$ metal contact electrically connects bottom S/D regions of the $2^{nd}$ PU and $2^{nd}$ PD transistors. A $1^{st}$ cross-coupled contact electrically connects the $2^{nd}$ common gate structure to the 1st metal contact. The 2nd common gate structure entirely surrounds a perimeter of the 1st cross-coupled contact. A 2nd cross-coupled contact electrically connects the 1st common gate structure to the 2nd metal contact. The 1st common gate structure entirely surrounds a perimeter of the 2nd cross-coupled contact.

A method in accordance with one or more aspects of the present invention includes providing a vertical SRAM cell structure having a substrate, bottom S/D regions for 1st PU, 1st PD, 1st PG, 2nd PU, 2nd PD and 2 PG transistors, a 1st metal contact electrically connecting the 1st PU and 1st PD transistors and a 2nd metal contact electrically connecting the 2nd PU and 2nd PD transistors. Channels are etched into each of the bottom S/D regions. A single gate structure is formed for each of the 1st and 2nd PG transistors. A 1st common gate structure is formed for the 1st PU and 1st PD transistors and a 2nd common gate structure is formed for the 2nd PU and 2 PD transistors. Cross-coupled trenches are patterned and etched to penetrate an inner portion of each of the 1st and 2nd common gate structures without extending over any sidewalls of the 1st and 2nd common gate structures. 1st and 2nd cross-coupled contacts are formed into the gate trenches of the 1st and 2nd common gate structures respectively.

DRAWINGS

The invention will be more fully understood from the following detailed description taken in conjunction with the accompanying drawings, in which:

FIG. 5A is an exemplary embodiment of a perspective/top/right-side view of the structure of the vertical SRAM cell of FIG. 4 in accordance with the present invention;

FIG. 5B is a top view of exemplary embodiment of the SRAM cell structure of FIG. 5A in accordance with the present invention;

FIG. 5C is a perspective/lower/right-side view of the exemplary embodiment of the SRAM cell structure of FIG. 5B taken along the line 5C-5C of FIG. 5B in accordance with the present invention;

FIG. 6A is a cross-sectional view of the exemplary embodiment of the SRAM cell structure of FIG. 5A taken along the line 6A-6A of FIG. 5A in accordance with the present invention;

FIG. 6B is a cross-sectional view of the exemplary embodiment of the prior art SRAM cell structure of FIG. 1A taken along the line 6B-6B of FIG. 1A for purposes of comparison to FIG. 6A;

Figure 16:
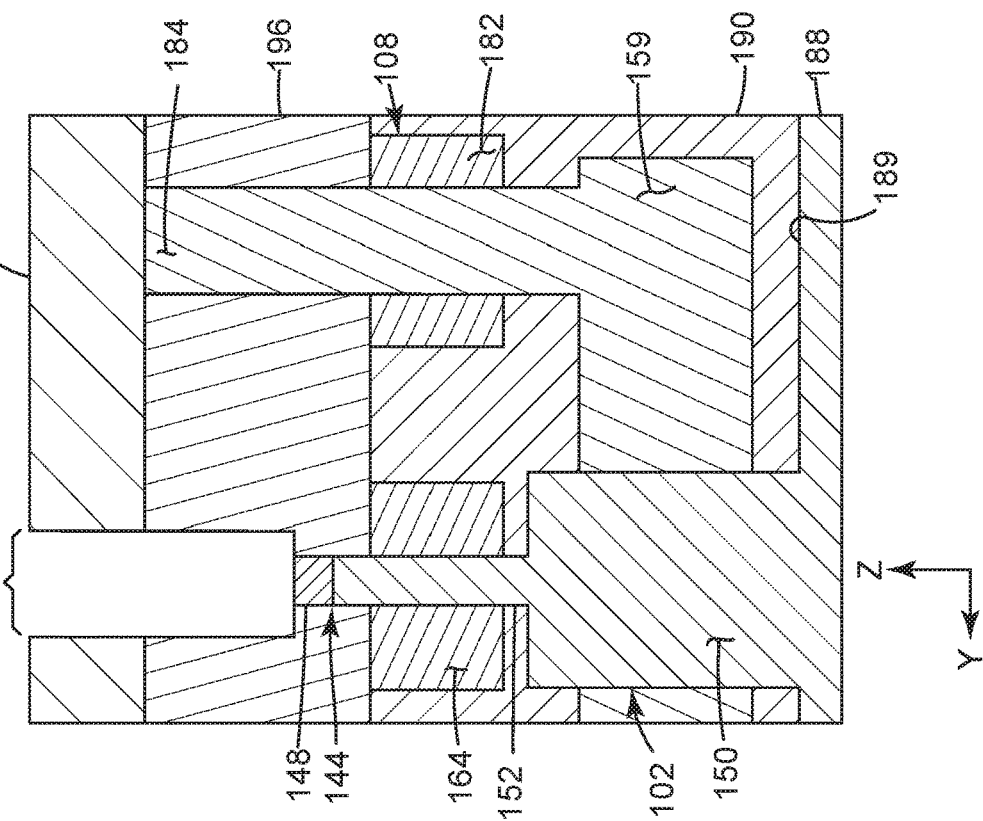
FIG. 16 is a cross-sectional view of an exemplary embodiment of the vertical SRAM cell structure of FIG. 15 having a CA contact disposed in the upper S/D region trench in accordance with the present invention.
Figure 19:
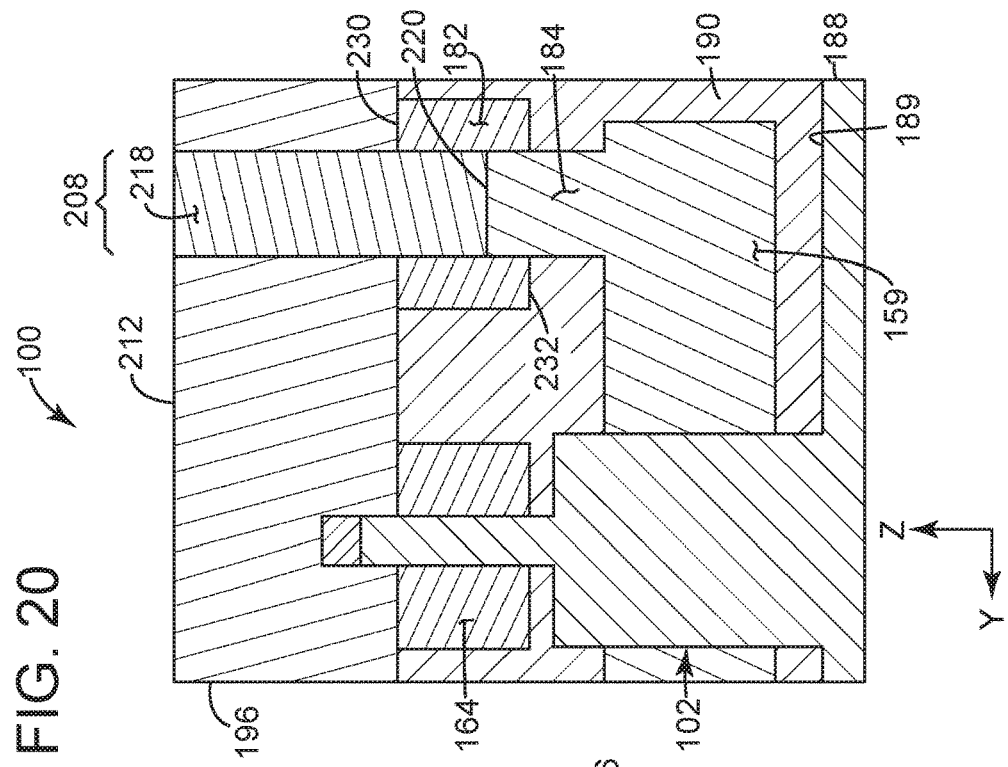
Figure 20:
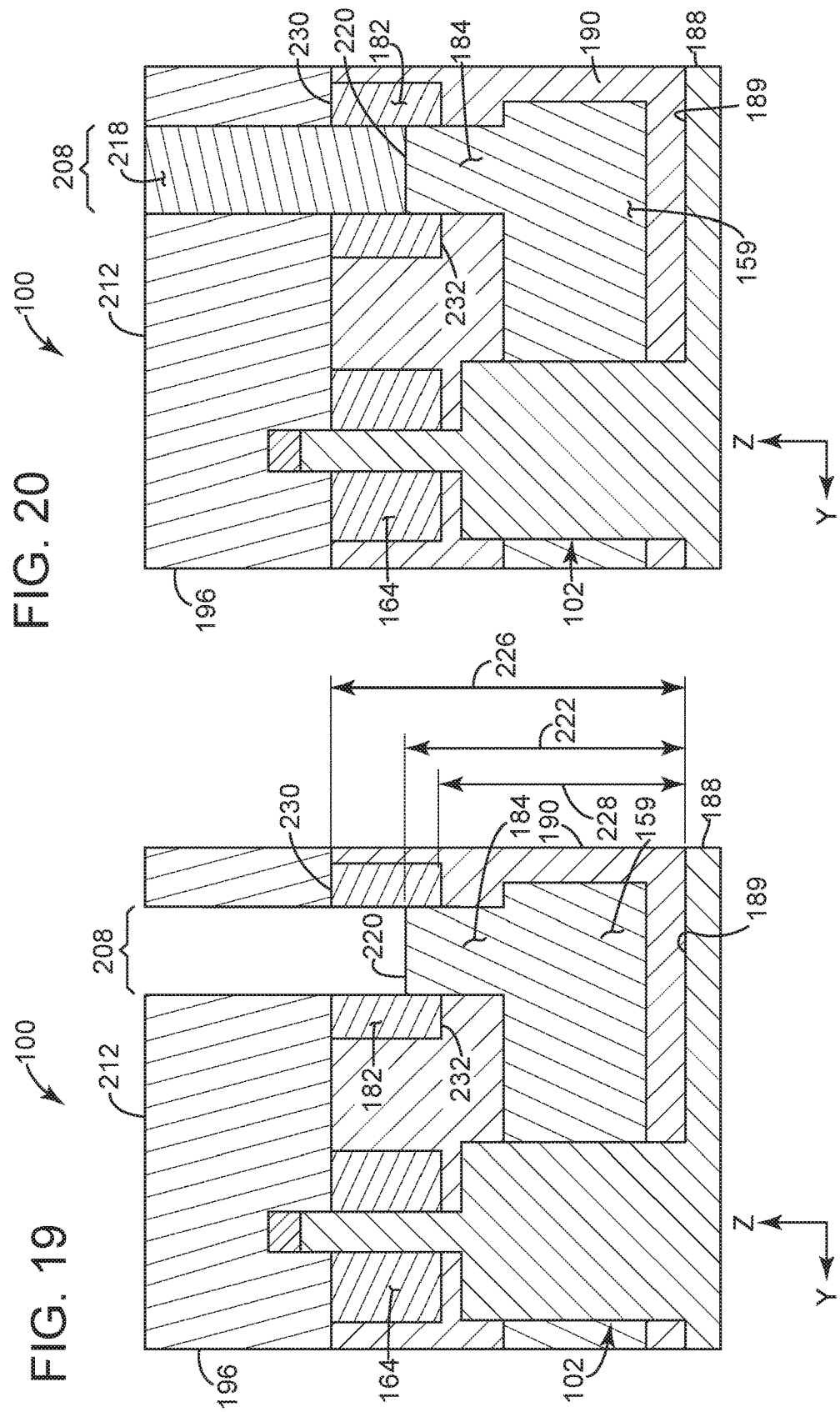
Figure 21:
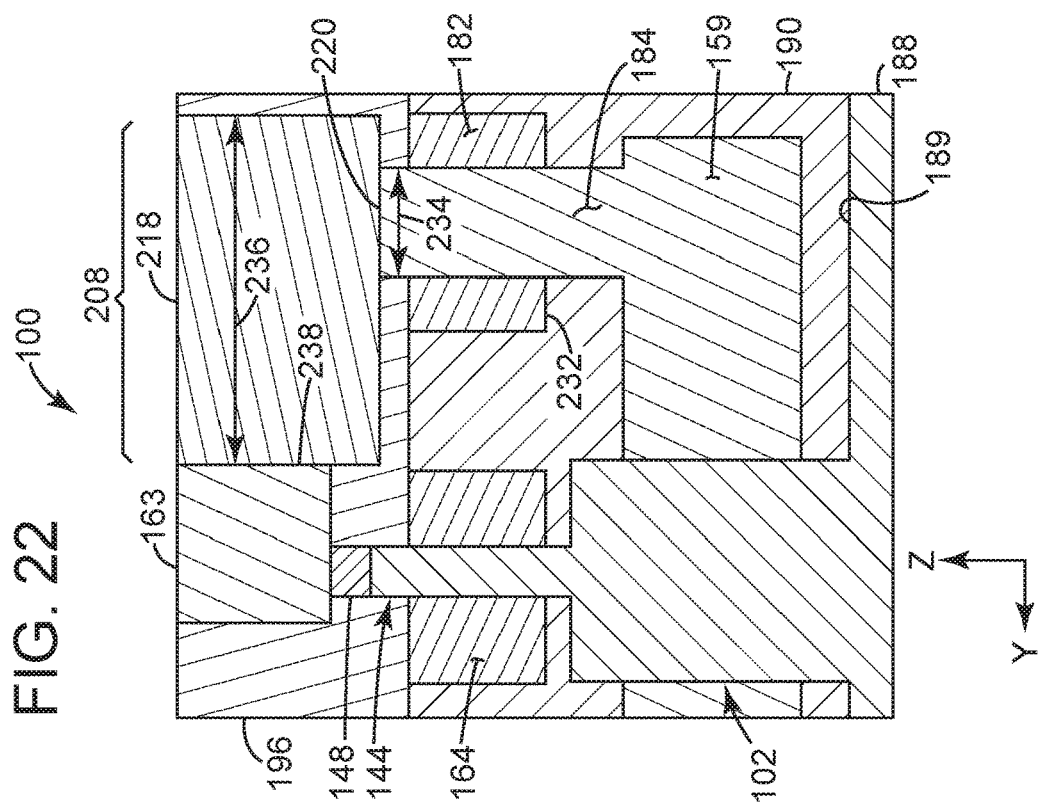
Figure 22:
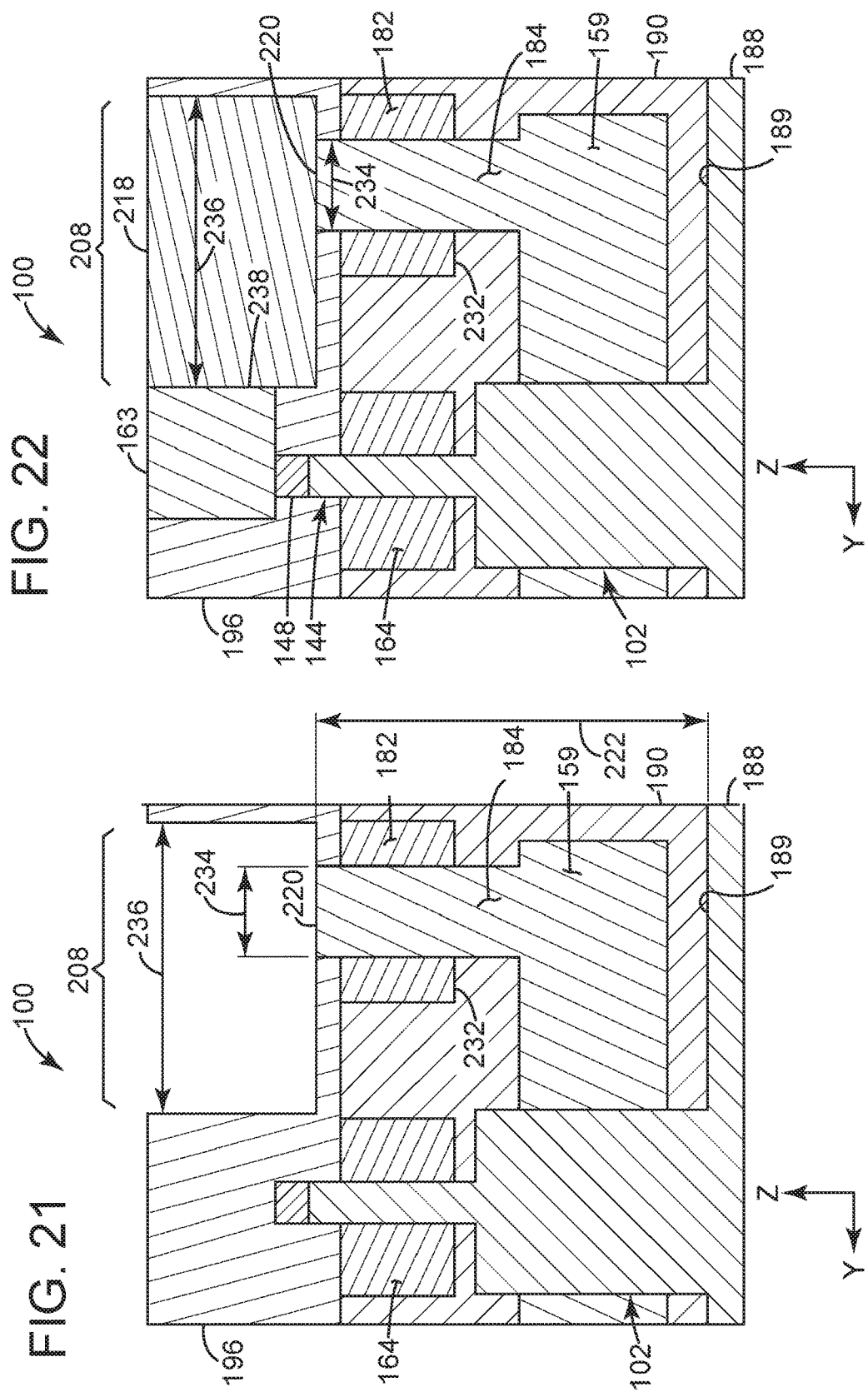

FIG. 19 is a cross-sectional view of another alternative exemplary embodiment of the vertical SRAM cell structure of FIG. 16 at an intermediate stage of manufacture having a cross-coupled contact recessed into the cross-coupled trench to a height that is below the height of the top surface of the gate structures and above a height of a bottom surface of the gate structures in accordance with the present invention;

FIG. 20 is a cross-sectional view of an exemplary embodiment of the vertical SRAM cell structure of FIG. 19 having a dielectric plug disposed in the cross-coupled trench over the cross-coupled contact in accordance with the present invention;

FIG. 21 is a cross-sectional view of another alternative exemplary embodiment of the vertical SRAM cell structure of FIG. 16 at an intermediate stage of manufacture having a cross-coupled contact recessed into the cross-coupled trench and the trench being widened to have a width that is larger than a width of the cross-coupled contact in accordance with the present invention;

FIG. 22 is a cross-sectional view of the exemplary embodiment of the vertical SRAM cell structure of FIG. 21 having a dielectric plug disposed in the cross-coupled trench and having a CA contact self-aligned with a sidewall of the dielectric plug in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1A:
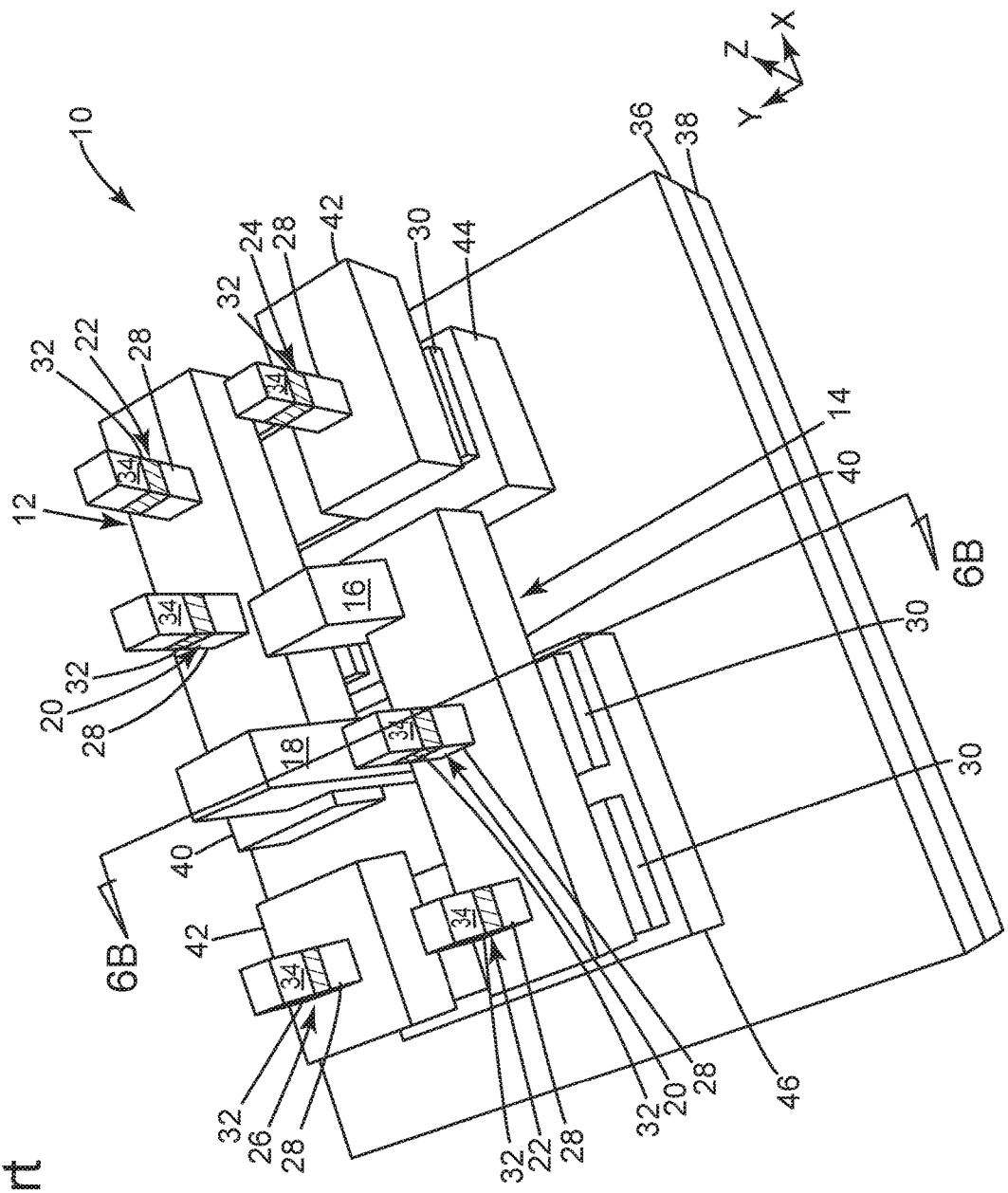
FIG. 1A is an exemplary embodiment of a perspective/top/right-side view of the structure of a prior art vertical SRAM cell structure.
Figure 1B:
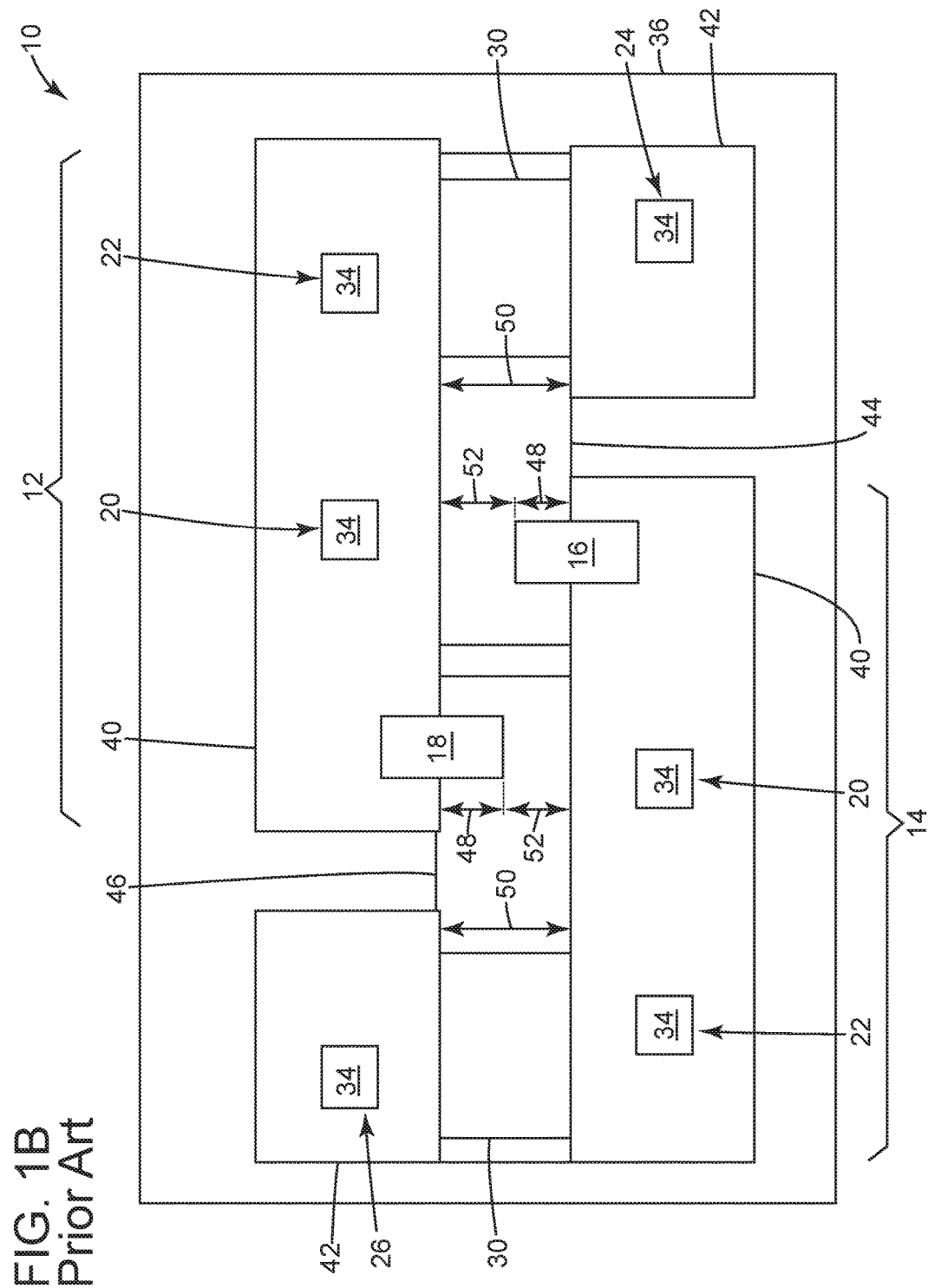
FIG. 1B is a top view of the exemplary embodiment of the prior art SRAM cell structure of FIG. 1A.
Figure 2:
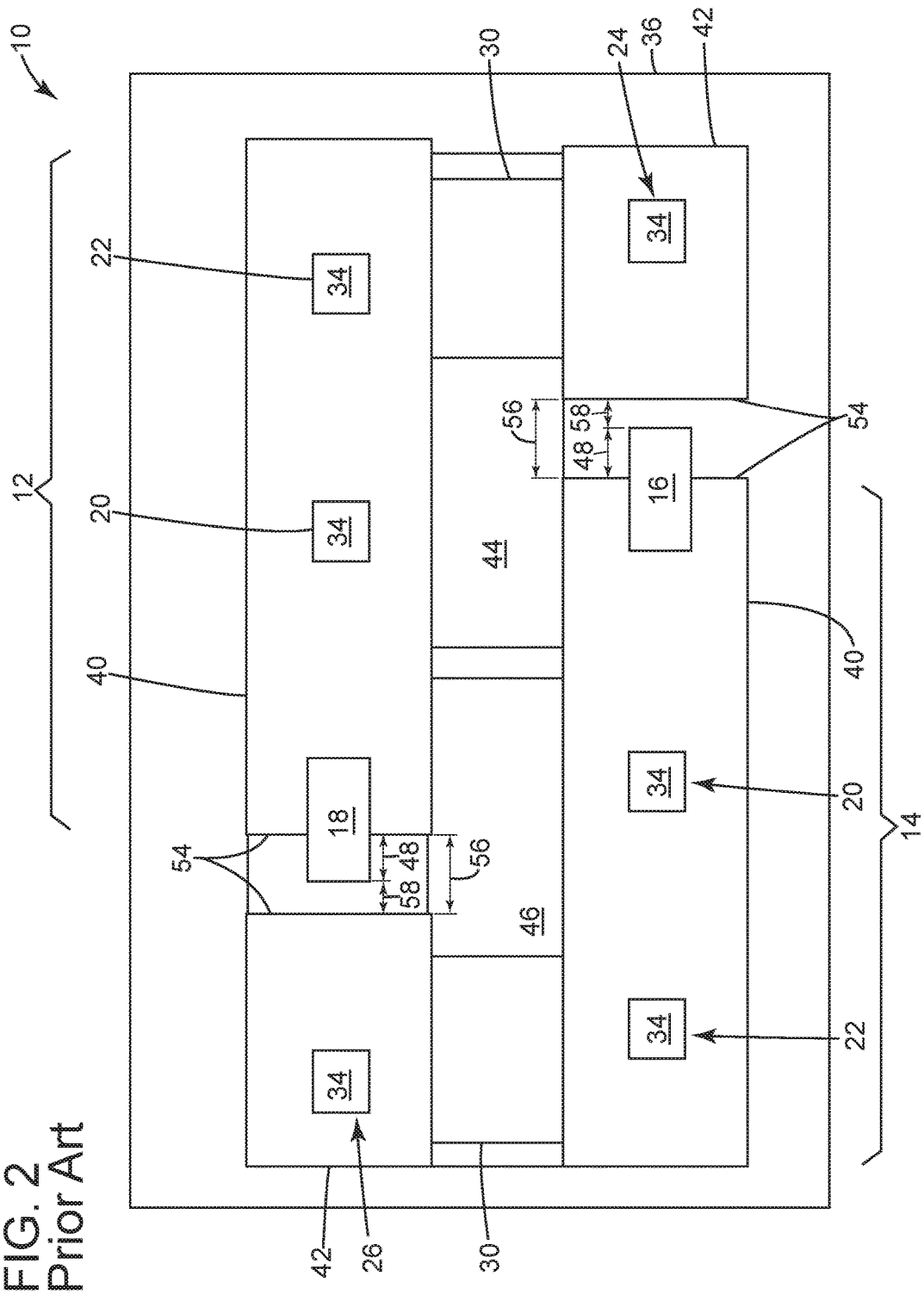
FIG. 2 is a top view of an alternative exemplary embodiment of the prior art SRAM cell structure of FIG. 1A.

FIGS. 1A-2 illustrate various exemplary embodiments of a prior art vertical static random access memory (SRAM) cell structure 10. FIGS. 3-22 illustrate various exemplary embodiments of structure of a vertical SRAM cell 100, and methods of making the vertical SRAM cell 100, in accordance with the present invention.

Referring to FIG. 1A, an exemplary embodiment of a perspective view of a prior art vertical SRAM cell structure 10 is presented. Prior art vertical SRAM cell structure 10 includes first ($1^{st}$) and second ($2^{nd}$) inverters 12, 14 that are cross-coupled together by $1^{st}$ and $2^{nd}$ cross-coupled contacts 16, 18 to form $1^{st}$ and $2^{nd}$ storage nodes with opposing logic states. Each inverter 12, 14 includes a vertical, p-type, pull-up (PU) transistor 20 and a vertical, n-type, pull-down (PD) transistor 22. The $1^{st}$ and $2^{nd}$ storage nodes are connected to vertical, n-type, $1^{st}$ and $2^{nd}$ pass-gate (PG) transistors 24, 26 respectively.

All of the PU, PD and PG transistors 20, 22, 24, 26 in the vertical SRAM cell 10 are referred to herein as vertical transistors because they all have channels 28 (such as a nanowire type channel, a fin type channel or the like) that extend vertically upwards from a bottom source/drain (S/D) region 30 to an upper S/D region 32. Disposed over each upper S/D region 32 are CA contacts 34 that connect to external electrical sources such as bit lines, word lines, voltage sources and voltage grounds (not shown).

The bottom S/D regions 30 are embedded in a substrate 38. A flowable oxide (FOX) layer 36 is disposed over the substrate 38 and surrounds the lower portion of the bottom S/D regions 30.

The PU transistors 20 and PD transistors 22 of each inverter 12, 14 share a common gate structure 40 that surround the channels 28 and are disposed above the bottom S/D regions 30 and below the upper S/D regions 32 of the PU and PD transistors 20, 22. The $1^{st}$ PG transistor 24 and $2^{nd}$ PG transistor 26 are each connected to a single gate structure 42. The gate structures 42 are disposed above the bottom S/D regions 30 and below the upper S/D regions 32 of the $1^{st}$ and $2^{nd}$ PG transistors 24, 26.

The bottom S/D regions 30 of the PU and PD transistors 20, 22 of the $1^{st}$ inverter 12 are electrically connected together through a $1^{st}$ metal contact 44. The bottom S/D regions 30 of the PU and PD transistors 20, 22 of the $2^{nd}$ inverter 14 are electrically connected together through a $2^{nd}$ metal contact 46. This is because the p-type bottom S/D region of the PU transistor 20 and the n-type bottom S/D region of the PD transistor 22 cannot be connected directly together without forming an n-p junction. Therefore, to avoid the formation of such an n-p junction, the metal contacts 44, 46 are utilized to provide electrical continuity between the bottom S/D regions 30 of the PU and PD transistors 20, 22.

To avoid the formation of such an n-p junction, the metal contacts 44, 46 only need to connect the bottom S/D regions of the PU and PD transistors 20, 22. However in this embodiment, the metal contacts 44, 46 of each inverter 12, 14 makes electrical contact with the PG transistors 24, 26 as well.

Referring to FIG. 1B, a top view of the prior art vertical SRAM cell 10 is presented. The $1^{st}$ cross-coupled contact 16 electrically connects the common gate structure 40 of the $2^{nd}$ inverter 14 to the $1^{st}$ metal contact 44 of the $1^{st}$ inverter 12. Additionally the $2^{nd}$ cross-coupled contact 18 electrically connects the common gate structure 40 of the Pt inverter 12 to the $2^{nd}$ metal contact 46 of the $2^{nd}$ inverter 14.

However, prior art cross-coupled contacts 16, 18 in the prior art vertical SRAM cell 10 extend around and between the edges of the common gate structures 40 in order to be able to land on the metal contacts 44, 46. The extension distances 48 of the cross-coupled contacts 16, 18 between the gate structures 40 increases the minimum pitch distance 50 between the gates structures 40. This is because, a minimum $1^{st}$ separation distance 52 must be maintained between adjacent edges of the cross-coupled contacts 16, 18 and the edges of the gate structures 40 in order to prevent the cross-coupled contacts 16, 18 from undesirably shorting to those adjacent gates structures 40. Therefore, the overall minimum footprint that prior art vertical SRAM cells 10 can be down-sized to is limited, at least in part, by the extension distances 48 of the cross-coupled contacts 16, 18 between the gate structures 40.

Additionally, these prior art cross-coupled contacts 16, 18 physically abut the gate structures 40 on only one side, rather than around the entire perimeter, of the cross-coupled contacts 16, 18. As such, the area of contact between a prior art cross-coupled contact 16, 18 and the gate structure 40 it connects to is limited to just one side of the abutting cross-coupled contact 16, 18. This limited area of contact becomes increasingly problematic for the flow of electricity between inverters 12, 14 as the SRAM cell 10 is down-sized.

Referring to FIG. 2, a top view of an alternative exemplary embodiment of the prior art SRAM cell structure 10 of FIG. 1A is presented. In this embodiment, the cross-coupled contacts 16, 18 are disposed on the tips 54 of the gate structures 40, rather than the edges.

In this embodiment, the extension distances 48 of the cross-coupled contacts 16, 18 between the gate structures 40 increases the minimum tip to tip distance 56 between the gates structures 40. This is because, a minimum separation distance 58 must be maintained between the adjacent edges of the cross-coupled contacts 16, 18 and the tips of the gate structures 40, 42 in order to prevent the cross-coupled contacts 16, 18 from undesirably shorting to those adjacent gates structures 40, 42. Therefore, the overall minimum footprint that prior art vertical SRAM cells 10 can be down-sized to is limited in this embodiment as well.

Figure 3:
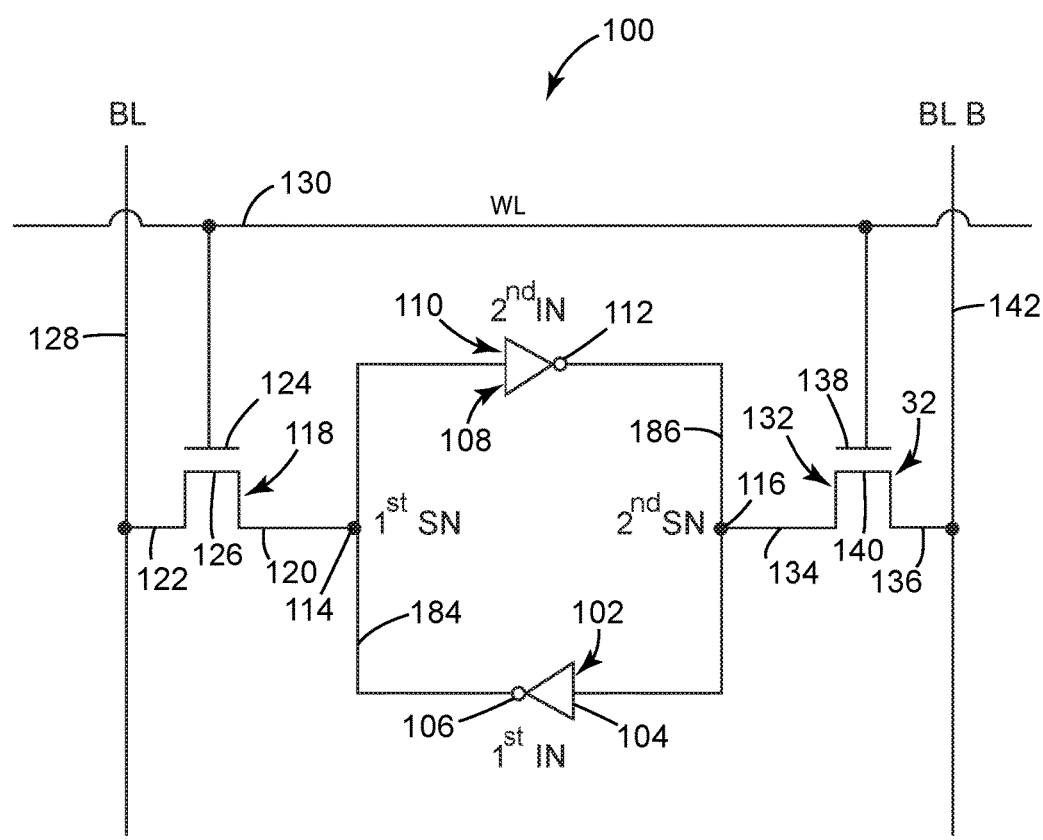
FIG. 3 is a schematic of an exemplary embodiment of a vertical SRAM cell structure showing 1st and 2nd pass gate transistors and a pair of cross coupled 1st and 2nd inverters in accordance with the present invention.

Referring to FIG. 3, a schematic of an exemplary embodiment of a vertical SRAM cell 100 (or vertical SRAM cell structure 100) having penetrating cross-coupled contacts 184, 186 (best seen in FIGS. 5A and 5B), in accordance with the present invention, is shown. In its most basic form, the SRAM cell 100 includes a $1^{st}$ inverter ($1^{st}$ IN) 102 having a $1^{st}$ inverter input 104 and a $1^{st}$ inverter output 106. SRAM cell 100 also includes a $2^{nd}$ inverter ($2^{nd}$ IN) 108 having a $2^{nd}$ inverter input 110 and a $2^{nd}$ inverter output 112. The $1^{st}$ inverter 102 and $2^{nd}$ inverter 108 are electrically cross-coupled to form a $1^{st}$ storage node ($1^{st}$ SN) 114 and a $2^{nd}$ storage node ($2^{nd}$ SN) 116.

More specifically, the $1^{st}$ inverter output 106 electrically contacts the $2^{nd}$ inverter input 110 through the $1^{st}$ cross-coupled contact 184 to form the $1^{st}$ storage node 114. Additionally, the $2^{nd}$ inverter output 112 electrically contacts the $1^{st}$ inverter input 104 through the $2^{nd}$ cross-coupled contact 186 to form the $2^{nd}$ SN 116. By virtue of the cross-coupling, the two storage nodes 114, 116 will always have two opposing output signals and the SRAM cell 100 will always have two stable logic states. That is, the first logic state includes a logic 1 (or voltage high signal) at the 1st storage node 114 and a logic 0 (or voltage low signal) at the $2^{nd}$ storage node 116. The second logic state includes a logic 0 at the $1^{st}$ storage node 114 and a logic 1 at the $2^{nd}$ storage node 116.

A first ($1^{st}$), typically n-type, pass gate (PG) transistor 118 is electrically connected to the $1^{st}$ storage node 114 through its drain region 120. The source region 122 of the $1^{st}$ PG transistor 118 is connected to a bit line (BL) 128. A gate structure 124 of the $1^{st}$ PG transistor 118 is connected to a word line (WL) 130. The gate structure 124 is operative to control electrical flow through a channel 126 of the $1^{st}$ PG transistor 118. That is, when the gate structure 124 is activated by a logic high signal from the word line 130, current will flow through the channel 126 from the source region 122 to the drain region 120 of the $1^{st}$ PG transistor 118.

It should be noted that the source regions, such as source region 122, and the drain regions, such as drain region 120, for all the transistors in SRAM cell 100 can function interchangeably as either source or drain regions depending on application (for example, on application of a read operation or an application of a write operation of SRAM cell 100). Therefore, these source and drain regions may be referred to herein as source/drain (S/D) regions. Accordingly, source region 122 may also be referred to as S/D region 122, and drain region 120 may also be referred to as S/D region 120.

A second ($2^{nd}$), typically n-type, PG transistor 132 is electrically connected to the $2^{nd}$ storage node 116 through its S/D region 134. The S/D region 136 of the $2^{nd}$ PG transistor 132 is connected to a bit line bar (BLB) 142 (collectively, the BL 128 and BLB 142 being referred to herein as the "bit lines"). The gate structure 138 of the $2^{nd}$ PG transistor 132 is connected to the WL 130. The gate structure 138 is operative to control electrical flow through a channel 140 of the $2^{nd}$ PG transistor 132. That is, when the gate structure 138 is activated by a logic high signal from the word line 130, current will flow through the channel 140 from the S/D region 136 (which is functioning as a source region in this application) to the S/D region 134 (which is functioning as a drain region in this application) of the $2^{nd}$ PG transistor 132.

Figure 4:
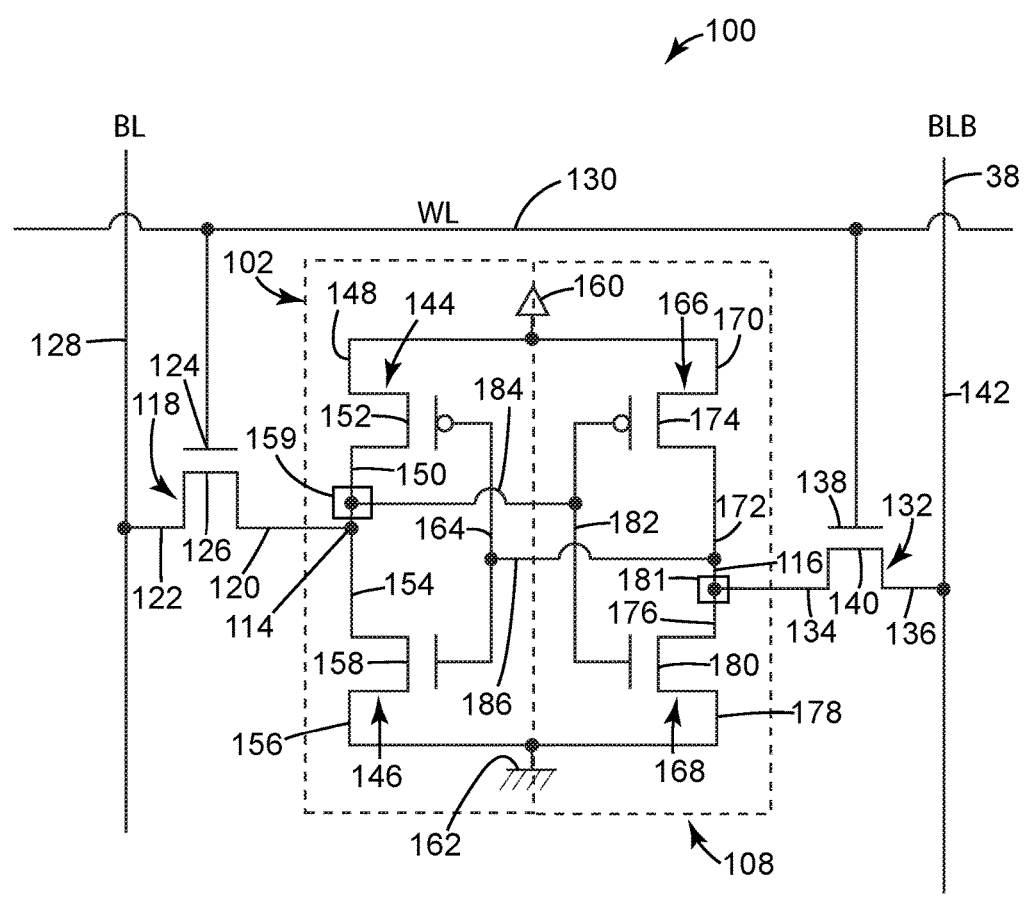
FIG. 4 is a schematic of an exemplary embodiment of the prior art vertical SRAM cell structure of FIG. 3 showing the 1st inverter as having a 1st PU and a 1st PD transistor and the 2nd inverter as having a 2nd PU and a 2nd PD transistor in accordance with the present invention.

Referring to FIG. 4, a schematic of an exemplary embodiment of the vertical SRAM cell 100 with a more detailed schematic view of the $1^{st}$ and $2^{nd}$ inverters 102, 108 in accordance with the present invention is shown. The $1^{st}$ inverter 102 of SRAM cell 100 commonly includes a first, typically p-type, pull-up (PU) transistor 144 and a first, typically n-type, pull-down (PD) transistor 146. The $1^{st}$ PU transistor 144 has a S/D region 148 (which functions herein as a source region) and a S/D region 150 (which functions herein as a drain region). The S/D regions 148, 150 are connected therebetween by a channel 152. The $1^{st}$ PD transistor 146 has a S/D region 154 (which functions herein as a source region) and a S/D region 156 (which functions herein as a drain region). The S/D regions 154, 156 are connected therebetween by a channel 158.

The S/D region 150 of the $1^{st}$ PU transistor 144 is electrically connected to the S/D region 154 of the $1^{st}$ PD transistor 146 through a $1^{st}$ metal contact 159. The $1^{st}$ metal contact 159 is being used in this exemplary embodiment to provide electrical continuity between the p-type S/D region 150 of transistor 144 and the n-type S/D region 154 of transistor 146. If the p-type S/D region 150 were to make direct contact with the n-type S/D region 154, an n-p junction would be formed that would significantly impede the flow of electricity.

In this embodiment, the $1^{st}$ metal contact 159 is disposed solely on sidewalls 192 (best seen in FIG. 5C), and not on any top surfaces 194, of the S/D regions 150 and 154. However, in other embodiments, the $1^{st}$ metal contact 159 may be disposed on top surfaces 194 as well.

The S/D region 148 of the $1^{st}$ PU transistor 144 is electrically connected with a supply voltage 160 (which may be designated herein as Vdd). The S/D region 156 of the $1^{st}$ PD transistor 146 is electrically connected with a voltage ground 162 (which may be designated herein as Vcc).

For purposes herein, the electrical contacts for the bit line 128, bit line bar 142, voltage supply 160 and voltage ground 162 may be designated collectively as the CA contacts 163 (best seen in FIG. 5A). This is because CA contacts typically connect to the source drain regions of a transistor and utilize a system of interconnect lines (not shown) to connect to such external electrical sources as the voltage supply 160, voltage ground 162, bit line 128 and bit line bar 142.

Also for purposes herein, the electrical contacts for the word lines 130 may be designated collectively as the CB contacts 165 (best seen in FIG. 5A). This is because CB contacts typically connect to the gate structures of a transistor and utilize a system of interconnect lines (not shown) to such external contacts as the word lines 130.

A $1^{st}$ common gate structure 164 is operatively connected to both the channel 152 of the $1^{st}$ PU transistor 144 and the channel 158 of the $1^{st}$ PD transistor 146. That is, the $1^{st}$ common gate structure 164 provides the gate structure which can simultaneously activate and deactivate the channels 152 and 158 of transistors 144 and 146 respectively.

The $2^{nd}$ inverter 108 of SRAM cell 100 commonly includes a second, typically p-type, pull-up (PU) transistor 166 and a second, typically n-type, pull-down (PD) transistor 168. The $2^{nd}$ PU transistor 166 has a S/D region 170 (which functions herein as a source region) and a S/D region 172 (which functions herein as a drain region). The S/D regions 170, 172 are connected therebetween by a channel 174. The $2^{nd}$ PD transistor 168 has a S/D region 176 (which functions herein as a source region) and a S/D region 178 (which functions herein as a drain region). The S/D regions 176, 178 are connected therebetween by a channel 180.

The S/D region 172 of the $2^{nd}$ PU transistor 166 is electrically connected to the S/D region 176 of the $2^{nd}$ PD transistor 168 through a $2^{nd}$ metal contact 181. The $2^{nd}$ metal contact 181 is being used in this exemplary embodiment to bridge the electrical continuity between the p-type S/D region 172 of transistor 166 and the n-type S/D region 176 transistor 168. If the p-type S/D region 172 were to make direct contact with the n-type S/D region 176, an n-p junction would be formed that would significantly impede the flow of electricity.

In this embodiment the $2^{nd}$ metal contact 181 is disposed solely on sidewalls 192 (best seen in FIG. 5C), and not on any top surfaces 194, of the S/D regions 172 and 176. However, in other embodiments, the $2^{nd}$ metal contact 181 may be disposed on top surfaces 194 as well.

The S/D region 170 of the $2^{nd}$ PU transistor 166 is electrically connected with the supply voltage 160. The S/D region 178 of the $2^{nd}$ PD transistor 168 is electrically connected with the voltage ground 162.

A $2^{nd}$ common gate structure 182 is operatively connected to both the channel 174 of the $2^{nd}$ PU transistor 166 and the channel 180 of the $2^{nd}$ PD transistor 168. That is, the $2^{nd}$ common gate structure 182 provides the gate structure which can simultaneously activate and deactivate the channels 174 and 180 of transistors 166 and 168 respectively.

The $1^{st}$ cross-coupled contact 184 is in electrical contact with the $2^{nd}$ common gate structure 182 of the $2^{nd}$ inverter 108 and the $1^{st}$ metal contact 159 of the $1^{st}$ inverter 102. The $2^{nd}$ cross-coupled contact 186 is in electrical contact with the $1^{st}$ common gate structure 164 of the $1^{st}$ inverter 102 and the $2^{nd}$ metal contact 181 of the $2^{nd}$ inverter 108.

The $1^{st}$ cross-coupled contact 184 completes the formation of the $1^{st}$ storage node 114 by electrically cross-coupling the output 106 (best seen in FIG. 3) of the $1^{st}$ inverter 102 to the input 110 (best seen in FIG. 3) of the $2^{nd}$ inverter 108. The output 106 of the $1^{st}$ inverter 102 includes electrical continuity to the S/D region 120 of the $1^{st}$ PG transistor 118, the S/D region 150 of the $1^{st}$ PU transistor 144, the S/D region 154 of the $1^{st}$ PD transistor 146 and the $1^{st}$ metal contact 159. The input 110 of the $2^{nd}$ inverter 108 includes electrical continuity to the $2^{nd}$ common gate structure 182.

In this embodiment, the $1^{st}$ cross-coupled contact 184 physically penetrates the $2^{nd}$ common gate structure 182 (i.e., the input 110 of the $2^{nd}$ inverter 108) to make physical and electrical contact with $1^{st}$ the metal contact 159 disposed below the $2^{nd}$ common gate structure 182. However, the $1^{st}$ cross-coupled contact 184 may make physical and electrical contact with any element of the $1^{st}$ inverter output 106 (i.e., any of the S/D regions 120, 150, 154 and/or the $1^{st}$ metal contact 159).

Advantageously relative to prior art cross-coupled contacts 16 and 18 of prior art SRAM cell 10, the $1^{st}$ cross-coupled contact 184 does not extend around and between the edges of the gate structures 124, 138, 164, 182 in order to be able to land on the $1^{st}$ metal contact 159 below. Accordingly the $1^{st}$ cross-coupled contact 184 does not limit the pitch spacing or tip to tip spacing of the gate structures 124, 138, 164, 182 of any of the transistors of SRAM cell 100.

Additionally, by penetrating the $2^{nd}$ common gate structure 182, the $1^{st}$ cross-coupled contact 184 makes electrical contact with the $2^{nd}$ common gate structure 182 around its entire perimeter. As such, the $1^{st}$ cross-coupled contact 184 provides a larger cross-sectional area for electrical conduction through the gate structure 182 compared to that of prior art cross-coupled contacts 16, 18.

The $2^{nd}$ cross-coupled contact 186 completes the formation of the $2^{nd}$ storage node 116 by electrically cross-coupling the output 112 (best seen in FIG. 3) of the $2^{nd}$ inverter 108 to the input 104 (best seen in FIG. 3) of the $1^{st}$ inverter 102. The output 112 of the $2^{nd}$ inverter 108 includes electrical continuity to the S/D region 134 of the $2^{nd}$ PG transistor 132, the S/D region 172 of the $2^{nd}$ PU transistor 166, the S/D region 176 of the $2^{nd}$ PD transistor 168 and the $2^{nd}$ metal contact 181. The input 104 of the $1^{st}$ inverter 102 includes electrical continuity to the $1^{st}$ common gate structure 164.

In this embodiment, the $2^{nd}$ cross-coupled contact 186 physically penetrates the $1^{st}$ common gate structure 164 (i.e., the input 104 of the $1^{st}$ inverter 102) to make physical and electrical contact with the $2^{nd}$ metal contact 181 disposed below the $1^{st}$ common gate structure 164. However, the $2^{nd}$ cross-coupled contact 186 may make physical and electrical contact with any element of the $2^{nd}$ inverter output 112 (i.e., any of the S/D regions 134, 172, 176 and/or the $2^{nd}$ metal contact 181).

Advantageously relative to prior art cross-coupled contacts 16 and 18 of prior art SRAM cell 10, the $2^{nd}$ cross-coupled contact 186 does not extend around and between the edges of the gate structures 124, 138, 164, 182 in order to be able to land on the $2^{nd}$ metal contact 181 below. Accordingly the $2^{nd}$ cross-coupled contact 186 does not limit the pitch spacing or tip to tip spacing of the gate structures 124, 138, 164, 182 of any of the transistors of SRAM cell 100.

Additionally, by penetrating the $1^{st}$ common gate structure 164, the $2^{nd}$ cross-coupled contact 186 makes electrical contact with the $1^{st}$ common gate structure 164 around its entire perimeter. As such, the $2^{nd}$ cross-coupled contact 186 provides a larger cross-sectional area for electrical conduction through the gate structure 164 compared to that of prior art cross-coupled contacts 16, 18.

Figure 5D:
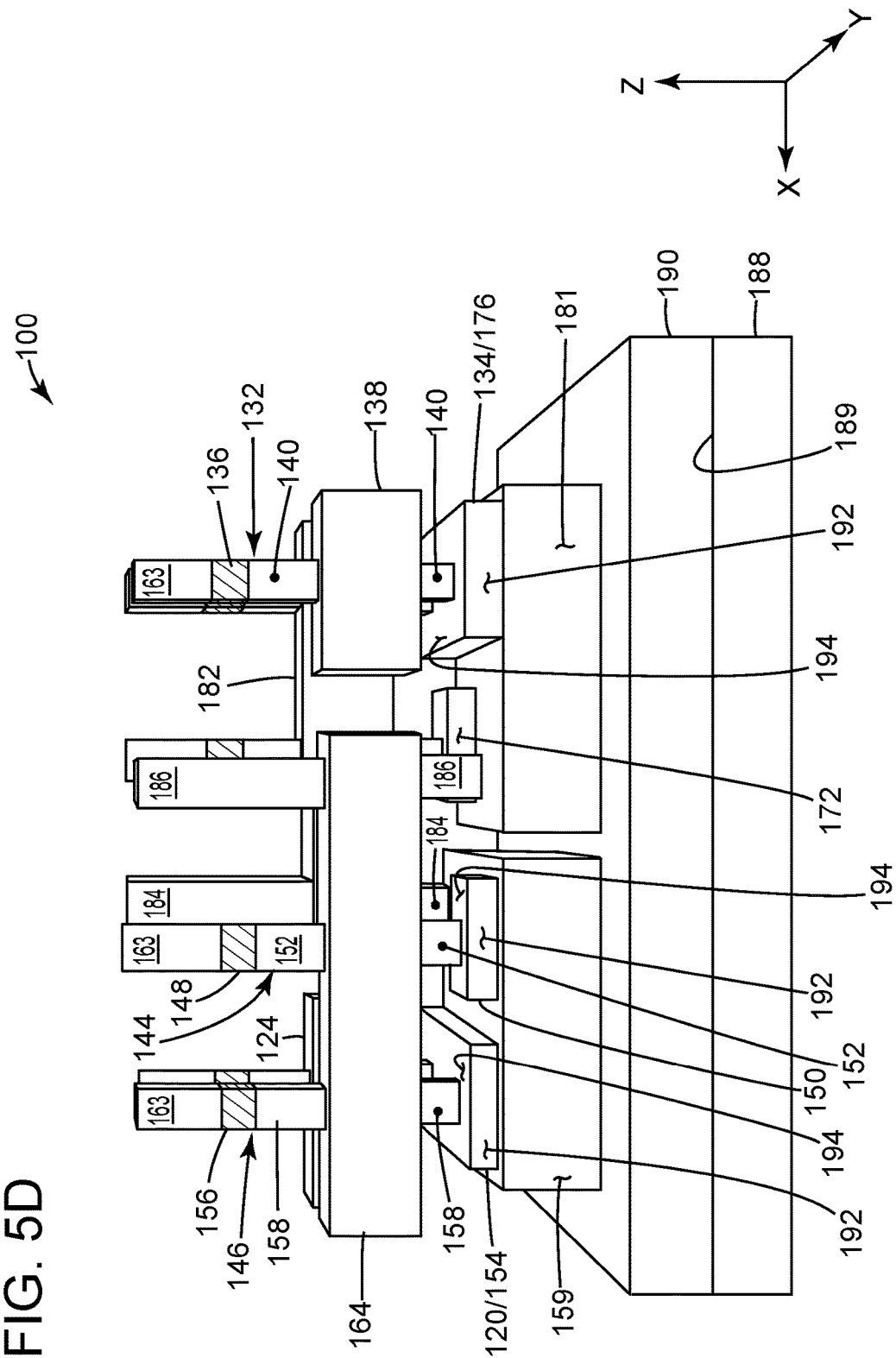
FIG. 5D is a perspective/lower/left-side view of the exemplary embodiment of the SRAM cell structure of FIG. 5B taken along the line 5D-5D of FIG. 5B in accordance with the present invention.

Referring to FIGS. 5A, 5B, 5C and 5D, various views of an exemplary embodiment of the physical structure of vertical SRAM cell 100 in accordance with the present invention is presented. More specifically, FIG. 5A is a perspective/top/right-side view of SRAM cell 100, FIG. 5B is a top view of SRAM cell 100, FIG. 5C is a perspective/lower/right-side view of SRAM cell 100 taken along the line 5C-5C of FIG. 5B and FIG. 5D is a perspective/lower/left-side view of SRAM cell 100 taken along the line 5D-5D of FIG. 5B.

In this embodiment, the vertical SRAM cell 100 (or vertical SRAM cell structure 100) is disposed over, and extends upwards, from a substrate 188, such as a silicon substrate. A flowable oxide layer 190 is disposed over the substrate 188 and around the SRAM cell 100. The SRAM cell 100 is referred to herein as a vertical SRAM cell because all of the transistors 118, 132, 144, 146, 166, 168 that makeup the SRAM cell include a bottom S/D region 120, 134, 150, 154, 172, 176 disposed on the substrate 188, a channel 126, 140, 152, 158, 174, 180 that extends vertically upwards from the bottom S/D region and an upper S/D region 122, 136, 148, 156, 170, 178 connected to an upper end of the channel.

The channels 126, 140, 152, 158, 174, 180, in this embodiment, are formed as nanowires extending vertically upwards. However, the channels may also be vertically upwards extending fins or other similar structures.

The $1^{st}$ inverter 102 includes the p-type $1^{st}$ PU transistor 144 and the n-type $1^{st}$ PD transistor 146. The bottom S/D region of the 1st PU transistor 144 is the S/D region 150. The bottom S/D region of the 1st PD transistor 146 is the S/D region 154. Both S/D regions 150, 154 are disposed on the substrate 188. Both S/D regions 150, 154 have a top surface 194 and sidewalls 192 (best seen in FIGS. 5C and 5D).

Since the S/D region 150 of the 1st PU transistor 144 is p-type and the S/D region 154 of the 1st PD transistor 146 is n-type, the 1st metal contact 159 is used to provide electrical continuity between them. To provide such electrical continuity the metal contact 159 may be disposed only on two adjacent sidewalls 192 of the two S/D regions 150, 154. However, in this embodiment, the 1st metal contact 159 is disposed on all sidewalls of both bottom S/D regions 150 and 154.

The channels 152 and 158 of the 1st PU and 1st PD transistors 144, 146, both extend vertically upwards from the top surfaces 194 of the S/D regions 150 and 154 respectively. Disposed on the upper ends of the channels 150, 154 are the upper S/D regions 148 and 156 of the transistors 144, 146. The voltage supply (Vdd) 160 is connected to the upper S/D region 148 through a CA contact 163. The voltage ground (Vcc) 162 is connected to the upper S/D region 156 through a CA contact 163.

The 1st common gate structure 164 is operatively connected to both channels 152, 158 of the 1st PU and 1st PD transistors 144, 146. By well-known processes, the 1st common gate structure 164 is disposed above the bottom S/D regions 150, 154 and below the upper S/D regions 148, 156 of the 1st PU and 1st PD transistors 144, 146.

For purposes of clarity, only the gate metal stacks of all of the gate structures 124, 138, 164 and 182 of the SRAM cell 100 are shown in FIGS. 5A through 5D. The well-known gate spacers, which insulate the gate metal stacks from the S/D regions and which would be located below and above the gate metal stacks, have not been drawn into FIGS. 5A through 5D. As such, the top surfaces 194 of the bottom S/D regions 120, 150, 154, 134, 172 and 176 are exposed for illustrative purposes. Also a top portion and lower portion of the channels 126, 140, 152, 158, 174 and 180, which extend vertically upwards from those top surfaces 194 and through the gate metal stacks, are also exposed for illustrative purposes.

Also for purposes herein, a top surface of the substrate 188 defines a substrate plane 189, wherein the longitudinal direction of the gate structures 124, 138, 164, 182 disposed over the top surface will be considered the X direction of the substrate plane 189 and the direction perpendicular to the X direction will be considered the Y direction of the substrate plane 189. Additionally, the direction perpendicular to the substrate plane 189 will be considered the vertical, or Z direction.

In this embodiment, the 1st metal contact 159 is disposed on the sidewalls 192, and not on the upper surfaces 194, of the bottom S/D regions 120, 150, 154 of the transistors 118, 144, 146. However, the metal contact 159 may be disposed on the top surfaces 194 in other embodiments.

The bottom S/D region of the 1st PG transistor 118 is the S/D region 120, which is disposed on the substrate 188. The S/D region 120 also has a top surface 194 and sidewalls 192 (best seen in FIGS. 5C and 5D).

Since the bottom S/D region 120 of the 1st PG transistor 118 is n-type and the bottom S/D region 154 of the 1st PD transistor 146 is also n-type, the S/D regions 120, 154 are formed as a single common bottom S/D region in this embodiment and may be referred to herein as S/D region 120/154. However, in other embodiments, the two S/D regions 120, 154 may be completely separate.

The channel 126 of the 1st PG transistors 118 extends vertically upwards from the top surface 194 of the S/D region 120/154. Disposed on the upper end of the channel 126 is the upper S/D region 122 of the 1st PG transistor 118. The bit line 128 is connected to the upper S/D region 122 through a CA contact 163.

The gate structure 124 is operatively connected to the channel 126 of the 1st PG transistor 118. By well-known processes, the gate structure 124 is disposed above the bottom S/D region 120/154 and below the upper S/D region 122 of the 1st PG transistor 118. The word line 130 is electrically connected to the gate structure 124 through a CB contact 165.

In this embodiment, the 1st metal contact 159 is also disposed on the sidewalls 192, and not on the upper surface 194, of the bottom S/D region 120/154 of the 1st PG transistor 118. However, the 1st metal contact 159 may be disposed on the upper surface 194 of the bottom S/D region 120/154 in other embodiments.

The 2nd inverter 108 includes the p-type 2nd PU transistor 166 and the n-type 2nd PD transistor 168. The bottom S/D region of the 2nd PU transistor 166 is the S/D region 172. The bottom S/D region of the 2nd PD transistor 168 is the S/D region 176. Both S/D regions 172, 176 are disposed on the substrate 188. Both S/D regions 172, 176 have a top surface 194 and sidewalls 192 (best seen in FIGS. 5C and 5D).

Since the S/D region 172 of the 2nd PU transistor 166 is p-type and the S/D region 176 of the 2nd PD transistor 168 is n-type, the 2nd metal contact 181 is used to provide electrical continuity between them. To provide such electrical continuity the metal contact 181 may be disposed only on two adjacent sidewalls 192 of the two S/D regions 172, 176. However, in this embodiment, the 2nd metal contact 181 is disposed on all sidewalls 192 of both bottom S/D regions 172 and 176.

The channels 174 and 180 of the 2nd PU and 2nd PD transistors 166, 168, both extend vertically upwards from the top surfaces 194 of the S/D regions 172 and 176 respectively. Disposed on the upper ends of the channels 174, 180 are the upper S/D regions 170 and 178 of the transistors 166, 168. The voltage supply (Vdd) 160 is connected to the upper S/D region 170 through a CA contact 163. The voltage ground (Vcc) 162 is connected to the upper S/D region 178 through a CA contact 163.

The 2nd common gate structure 182 is operatively connected to both channels 174, 180 of the 2nd PU and 2nd PD transistors 166, 168. By well-known processes, the 2nd common gate structure 182 is disposed above the bottom S/D regions 172, 176 and below the upper S/D regions 170, 178 of the 2nd PU and 2nd PD transistors 166, 168.

In this embodiment, the 2nd metal contact 181 is disposed on the sidewalls 192, and not on the upper surfaces 194, of the bottom S/D regions 172, 176 of the 2nd PU and 2ndPD transistors 166, 168. However, the metal contact 181 may be disposed on the top surfaces 194 in other embodiments.

The bottom S/D region of the 2nd PG transistor 132 is the S/D region 134, which is disposed on the substrate 188. The S/D region 134 also has a top surface 194 and sidewalls 192 (best seen in FIGS. 5C and 5D).

Since the bottom S/D region 134 of the 2nd PG transistor 132 is n-type and the bottom S/D region 176 of the 2nd PD transistor 168 is also n-type, the S/D regions 134, 176 are formed as a single common bottom S/D region in this embodiment and may be referred to herein as S/D region 134/176. However, in other embodiments, the two S/D regions 134, 176 may be completely separate.

The channel 140 of the 2$^{nd}$ PG transistors 132 extends vertically upwards from the top surface 194 of the S/D region 134/176. Disposed on the upper end of the channel 140 is the upper S/D region 136 of the 2$^{nd}$ PG transistor 132. The bit line bar 142 is connected to the upper S/D region 136 through a CA contact 163.

The gate structure 138 is operatively connected to the channel 140 of the 2$^{nd}$ PG transistor 132. By well-known processes, the gate structure 138 is disposed above the bottom S/D region 134/176 and below the upper S/D region 136 of the 2$^{nd}$ PG transistor 132. The word line 130 is electrically connected to the gate structure 138 through a CB contact 165.

In this embodiment, the 2$^{nd}$ metal contact 181 is also disposed on the sidewalls 192, and not on the upper surface 194, of the bottom S/D region 134/176 of the 2$^{nd}$ PG transistor 132. However, the 2$^{nd}$ metal contact 181 may be disposed on the upper surface 194 of the bottom S/D region 134/176 in other embodiments.

The 1$^{st}$ cross-coupled contact 184 is in electrical contact with the 2$^{nd}$ common gate structure 182 of the 2$^{nd}$ inverter 108 and the 1$^{st}$ metal contact 159 of the 1$^{st}$ inverter 102 to provide electrical continuity between the 2$^{nd}$ common gate structure 108 and the 1$^{st}$ metal contact 159. The 2$^{nd}$ cross-coupled contact 186 is in electrical contact with the 1$^{st}$ common gate structure 164 of the 1$^{st}$ inverter 102 and the 2$^{nd}$ metal contact 181 of the 2$^{nd}$ inverter 108 to provide electrical continuity between the 1$^{st}$ common gate structure 164 and the 2$^{nd}$ metal contact 181.

In this embodiment, the 1$^{st}$ and 2$^{nd}$ cross-coupled contacts 184, 186 land only on the 1$^{st}$ and 2$^{nd}$ metal contacts 159, 181 respectively. However, the 1$^{st}$ cross-coupled contact 184 may make physical and electrical contact with any element of the output 106 of the 1st inverter 102 (i.e., any of the bottom S/D regions 120, 150, 154 and/or the 1$^{st}$ metal contact 159). Additionally, the 2$^{nd}$ cross-coupled contact 186 may make physical and electrical contact with any element of the output 112 of the 2$^{nd}$ inverter 108 (i.e., any of the bottom S/D regions 134, 172, 176 and/or the 2$^{nd}$ metal contact 181).

Advantageously, the 1$^{st}$ cross-coupled contact 184 penetrates the 2$^{nd}$ common gate structure 182 (i.e., the input 110 of the 2$^{nd}$ inverter 108) and the 2$^{nd}$ cross-coupled contact 186 penetrates the 1$^{st}$ common gate structure 164 (the input 104 of the 1$^{st}$ inverter 102). That is, an entire perimeter of the 1$^{st}$ cross-coupled contact 184 is surrounded by the 2$^{nd}$ common gate structure 182 and an entire perimeter of the 2$^{nd}$ cross-coupled contact 186 is surrounded by the 1$^{st}$ common gate structure 164.

Advantageously relative to prior art cross-coupled contacts 16 and 18 of prior art SRAM cell 10, the 1$^{st}$ cross-coupled contact 184 does not extend beyond the edges of the 2nd common gate structure 182 in any direction (i.e., the X direction or Y direction) parallel to the substrate plane 189. Additionally, the 2$^{nd}$ cross-coupled contact 186 does not extend beyond the edges of the 1$^{st}$ common gate structure 164 in any direction (i.e., the X direction or Y direction) parallel to the substrate plane 189. Accordingly the 1$^{st}$ and 2$^{nd}$ cross-coupled contacts 184, 186 do not limit the pitch spacing or tip to tip spacing of the gate structures 124, 138, 164, 182 of any of the transistors 118, 132, 144, 146, 166, 168 of SRAM cell 100.

Additionally, the 1$^{st}$ cross-coupled contact 184 makes electrical contact with the 2$^{nd}$ common gate structure 182 around the entire perimeter of the 1$^{st}$ contact 184. Also the 2$^{nd}$ cross-coupled contact 186 makes electrical contact with the 1$^{st}$ common gate structure 164 around the entire perimeter of the 2$^{nd}$ contact 186. As such, the 1$^{st}$ and 2$^{nd}$ cross-coupled contacts 184, 186 provide larger cross-sectional areas for electrical conduction through the common gate structures 164, 182 compared to that of prior art cross-coupled contacts.

Referring to FIGS. 6A and 6B, a comparison of internal structures of an exemplary embodiment of the SRAM cell 100 and the prior art SRAM cell 10 is presented. More specifically with reference to FIG. 6A, a cross-sectional view of the exemplary embodiment of the SRAM cell structure 100 of FIG. 5A taken along the line 6A-6A of FIG. 5A is presented. Additionally more specifically with reference to FIG. 6B, a cross-sectional view of the exemplary embodiment of the prior art SRAM cell structure 10 of FIG. 1A taken along the line 6B-6B of FIG. 1A is presented.

In the embodiment of FIG. 6A, the common gate structures 164 and 182 are illustrated with their well-known gate spacers 195 surrounding the structures. In the embodiment of FIG. 6B, the common gate structures 40 are also illustrated with their well-known gate spacers 41 surrounding the structures.

Additionally with reference to both embodiments of FIGS. 6A and 6B, the thicknesses of the FOX layer 190 of SRAM cell 100 and the FOX layer 36 of SRAM cell 10 have been increased up to the level of top surfaces of their respective gate structures 164, 182, 40. Also in each embodiment, an additional dielectric layer 196 has been disposed over each structure 100 and 10 up to the level of top surfaces of the cross-coupled contacts 186 and 18 respectively.

It can be seen from FIG. 6A that the 2$^{nd}$ cross-coupled contact 186 of SRAM cell 100 completely penetrates the 1$^{st}$ common gate structure 164 to land solely on the 2$^{nd}$ metal contact 181. Therefore, the 2$^{nd}$ cross-coupled contact 186 does not interfere with a minimum pitch distance 197 between gate structures 182 and 164. Therefore the minimum separation distance 198 between the edges of the cross-coupled contact 186 and the edges of the adjacent gate structure 182 is at least as large as the minimum pitch distance 197 between the 1$^{st}$ and 2$^{nd}$ common gate structures 164, 182. In other words, the minimum separation distance 198 is greater than or equal to the minimum pitch distance 197.

It is important to note, that the relationship of separation distance 198 being at least as large as the pitch distance 197 also applies to the 1$^{st}$ cross-coupled contact 184 as well. This is because, as will be shown in greater detail herein, the 1$^{st}$ cross-coupled contact 184 penetrates the 2$^{nd}$ common gates structure 182 without extending between the edges of adjacent gate structures.

By comparison, the 2$^{nd}$ cross-coupled contact 18 of prior art SRAM cell 10 extends around and between the gate structures 40 in order to land partially on the 2$^{nd}$ metal contact 46 and partially on the bottom S/D region 30. As such, the extension distance 48 of the contact 18 interferes with the minimum pitch distance 50. As such the minimum separation distance 52 between the edges of the cross-coupled contact 18 and the edges of the adjacent common gate structure 40 is reduced to less than that of the minimum pitch distance 50.

Therefore, when downsizing prior art SRAM cell 10, a limiting factor is the minimum separation distance 52 rather than the minimum pitch distance 50. In contrast, when downsizing SRAM cell 100, a limiting factor is advantageously the minimum pitch distance 197, rather than the minimum separation distance 198.

Figure 7:
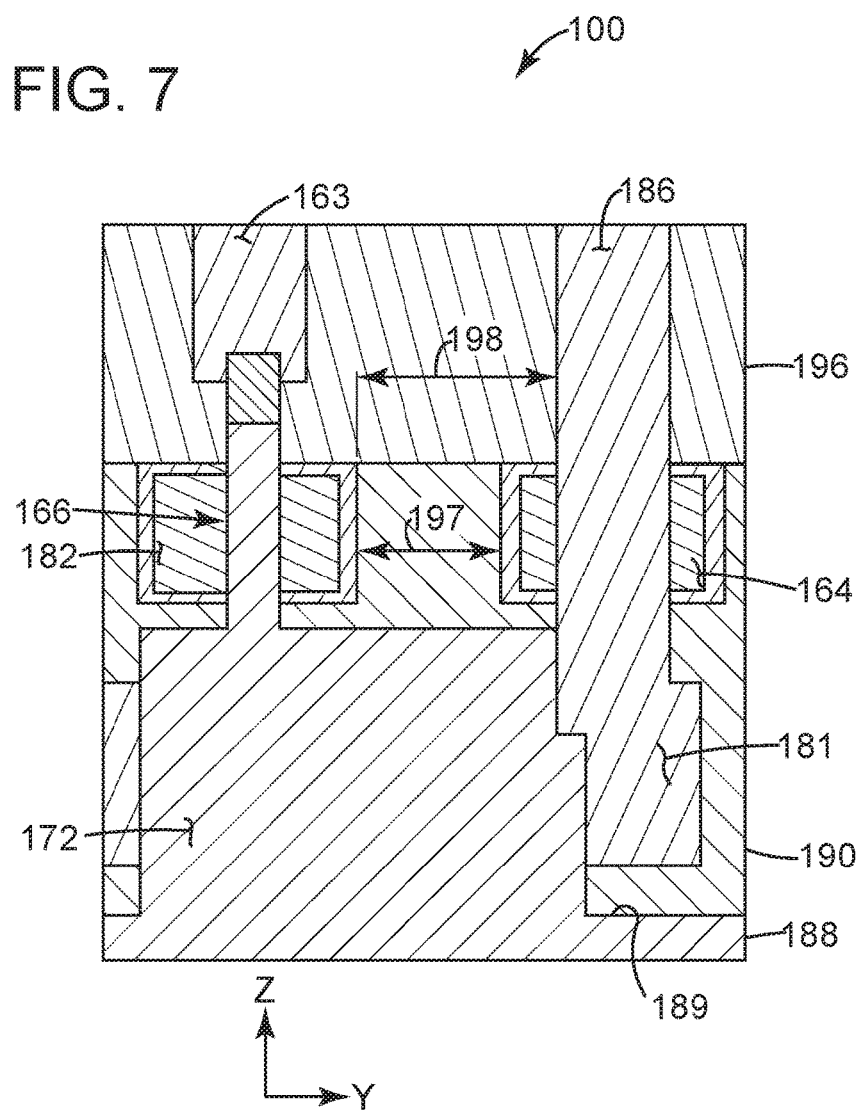
FIG. 7 is a cross-sectional view of an alternative exemplary embodiment of the SRAM cell structure of FIG. 5A taken along the line 6A-6A of FIG. 5A in accordance with the present invention.

Referring to FIG. 7, a cross-sectional view of an alternative exemplary embodiment of the SRAM cell structure 100 of FIG. 5A taken along the line 6A-6A of FIG. 5A in accordance with the present invention is presented. In this embodiment, the bottom S/D region 172 of the 2$^{nd}$ PU transistor 166 has been enlarged. Accordingly, the 2$^{nd}$ cross-coupled contact 186 lands almost exclusively on the bottom S/D region 172. Again, in this embodiment, the limiting factor is the minimum pitch distance 197 rather than the minimum separation distance 198.

FIGS. 8-22 illustrate various methods of making the vertical SRAM cell 100, in accordance with the present invention. Among other advantages, the methods illustrated show how the 1$^{st}$ and 2$^{nd}$ cross-coupled contacts 184, 186 are formed to penetrate the 2$^{nd}$ and 1$^{st}$ common gate structures 182, 164 respectively.

Figure 8:
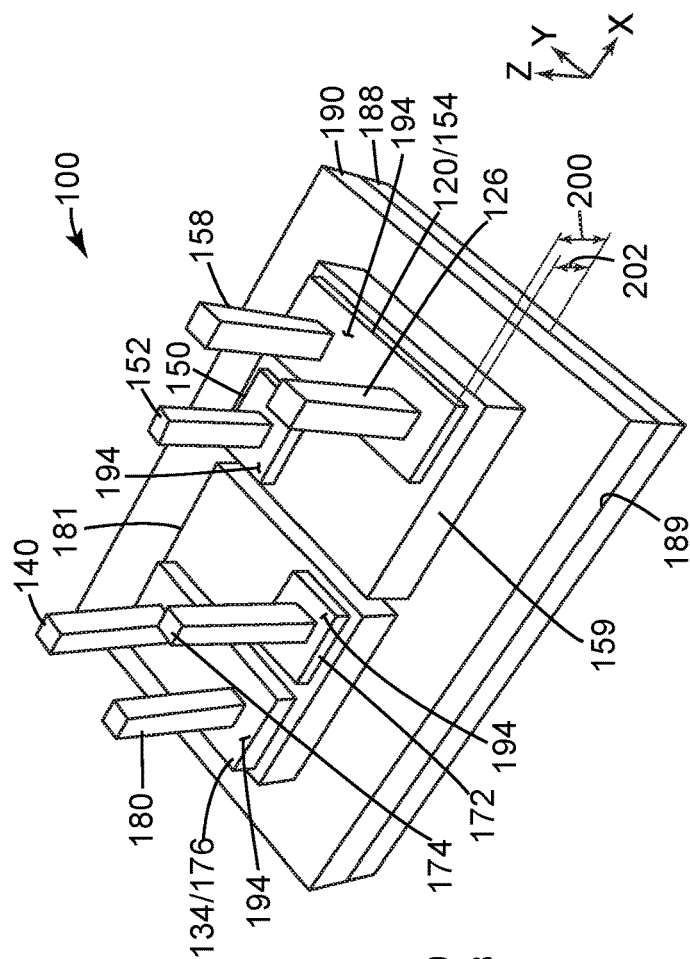
FIG. 8 is an exemplary embodiment of the vertical SRAM cell structure of FIG. 5A at an intermediate stage of manufacture having bottom S/D regions etched into a substrate and after formation of 1st and 2nd metal contacts in accordance with the present invention.

Referring to FIG. 8, a perspective view of an exemplary embodiment of the vertical SRAM cell 100 at an intermediate stage of manufacture is presented. At this stage of the process flow, the bottom S/D regions 120/154, 150, 134/176, 172 have been etched into the substrate 188. Also, the FOX layer 190 had been disposed over the substrate 188 and around the lower perimeter of the bottom S/D regions.

Additionally, the 1$^{st}$ and 2$^{nd}$ metal contacts 159, 181 have been formed over the FOX layer and around the bottom S/D regions by such means as atomic layer deposition (ALD) or similar. The metal contacts may be composed of such metals as tungsten (W), aluminum (Al), copper (Cu) or similar.

The 1$^{st}$ metal contact 159 must at least fill the space between the bottom S/D region 150 of the 1$^{st}$ PU transistor 144 and the bottom S/D region 120/154 of the 1$^{st}$ PD transistor 146. The 2$^{nd}$ metal contact 181 must at least fill the space between the bottom S/D region 172 of the 2$^{nd}$ PU transistor 166 and the bottom S/D region 134/176 of the 2$^{nd}$ PD transistor 168.

However, in this embodiment, the 1$^{st}$ metal contact 159 is disposed around the entire perimeters of the bottom S/D regions 120/154 and 150. Additionally, in this embodiment, the 2$^{nd}$ metal contact 181 is disposed around the entire perimeters of the bottom S/D regions 134/176 and 172.

Figure 9A:
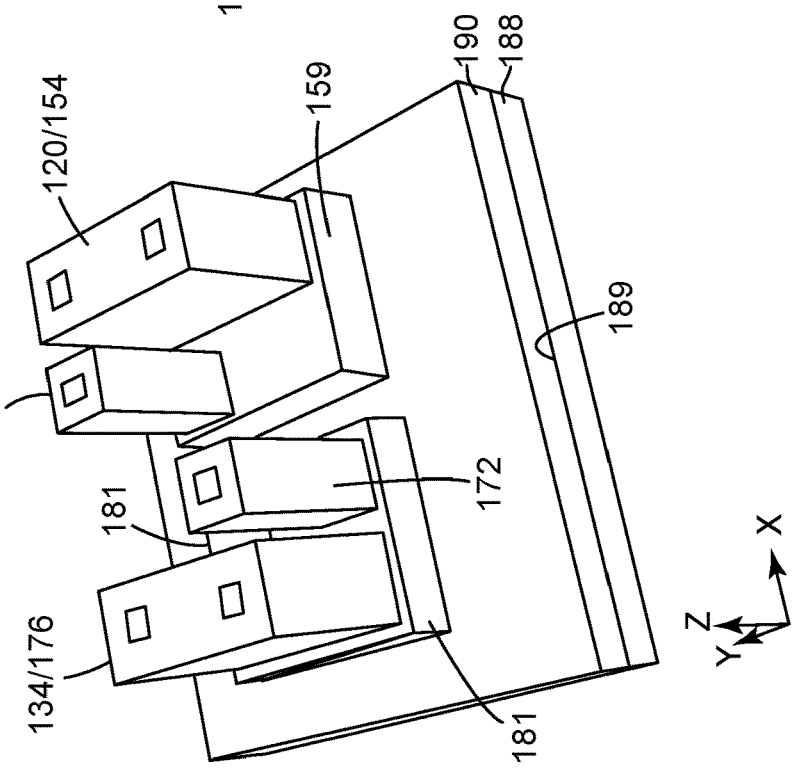
FIG. 9A is an exemplary embodiment of a perspective view of the vertical SRAM cell structure of FIG. 8 having vertically extending nanowire channels etched into the bottom S/D regions in accordance with the present invention.

Referring to FIG. 9A, next in the process flow, the channels 126, 140, 152, 158, 174, 180 are etched into the bottom S/D regions 120/154, 134/176, 150, 172. As such, the top surfaces 194 of the bottom S/D regions are recessed down to their final height 200. The final height 200 being equal to or greater than a height 202 of the metal contacts 159, 181 above the substrate layer 188, because in this embodiment the metal contacts are disposed on the sidewalls 192 of the bottom S/D regions only (best seen in FIGS. 5C and 5D).

In this embodiment, the channels 126, 140, 152, 158, 174, 180 are illustrated as nanowires. In this example, the cross-sectional area of the nanowires that is parallel to the substrate plane 189 is substantially square. However, the channels may be formed with a variety of other shapes and sizes as well. For example, the channels may be nanowires having a substantially round cross-sectional area.

Figure 9B:
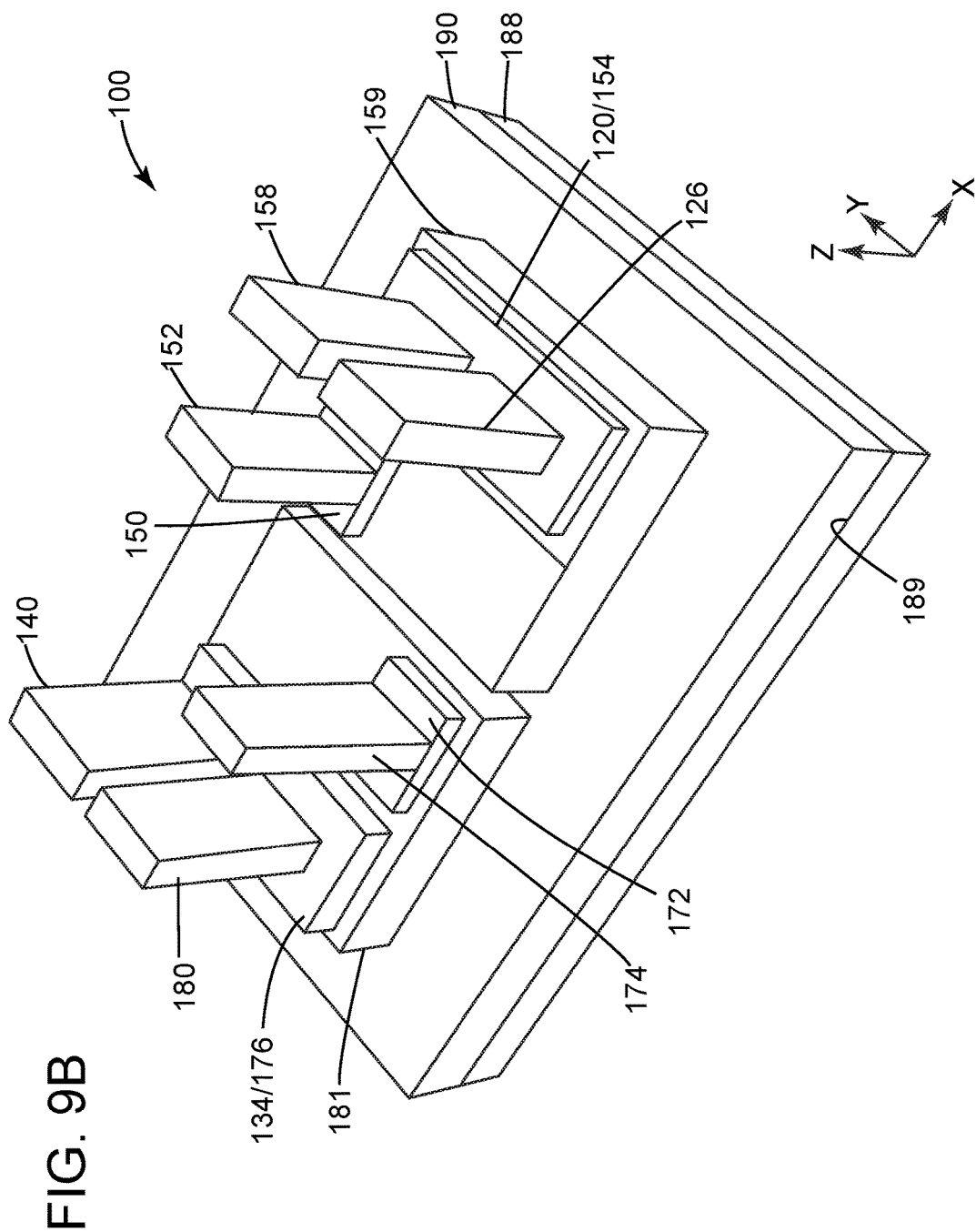
FIG. 9B is an alternative exemplary embodiment of a perspective view of the vertical SRAM cell structure of FIG. 8 having vertically extending fin channels etched into the bottom S/D regions in accordance with the present invention.

Referring to FIG. 9B, alternatively, the channels may be fins, rather than nanowires. In the embodiment illustrated in FIG. 9B, the cross-sectional area of the fins that is parallel to the substrate plane 189 is substantially rectangular, with the fins extending longitudinally in the Y direction.

Figure 10A:
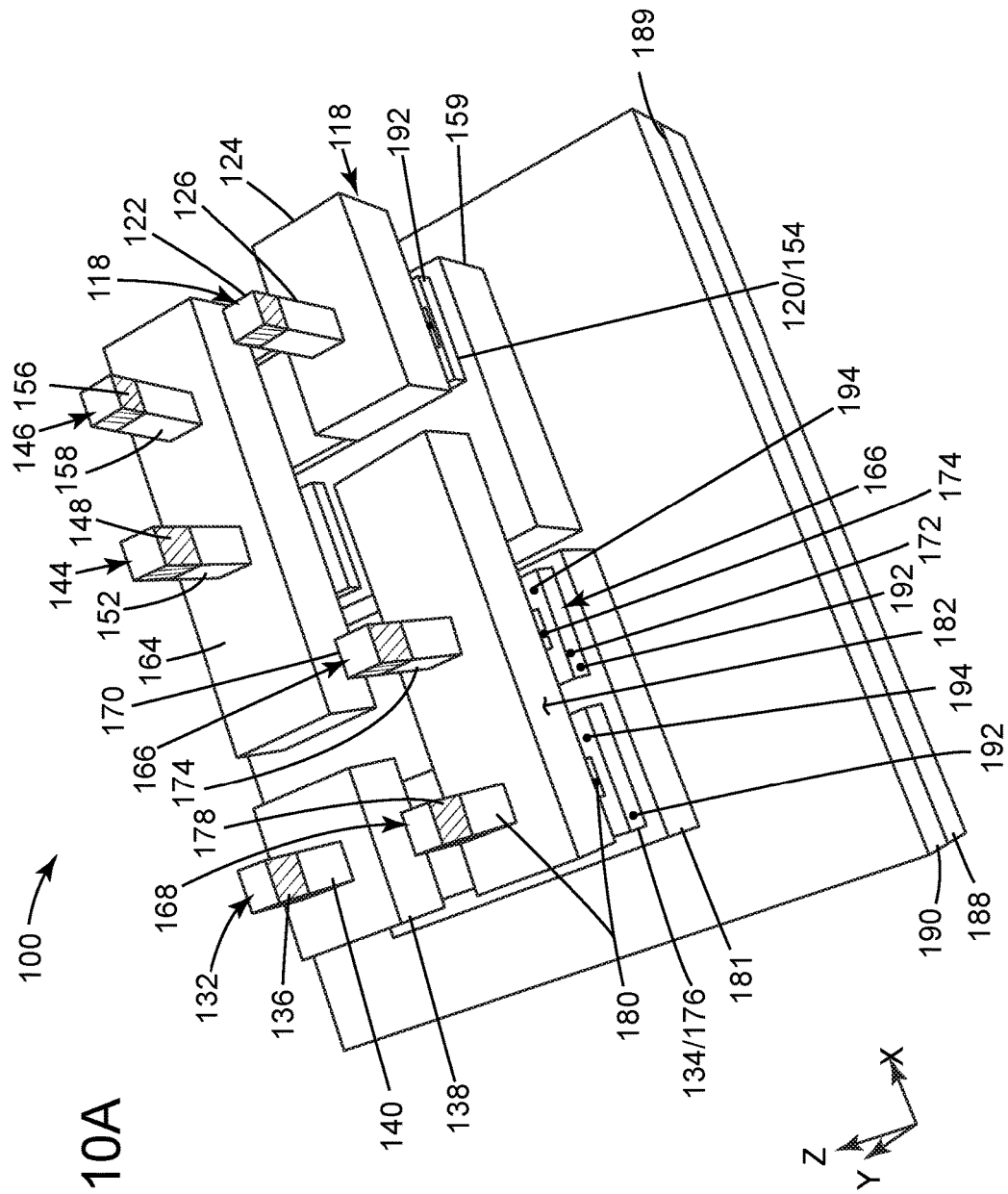
FIG. 10A is an exemplary embodiment of a perspective view of the vertical SRAM cell structure of FIG. 9A having gate structures disposed on the channels in accordance with the present invention.
Figure 10B:
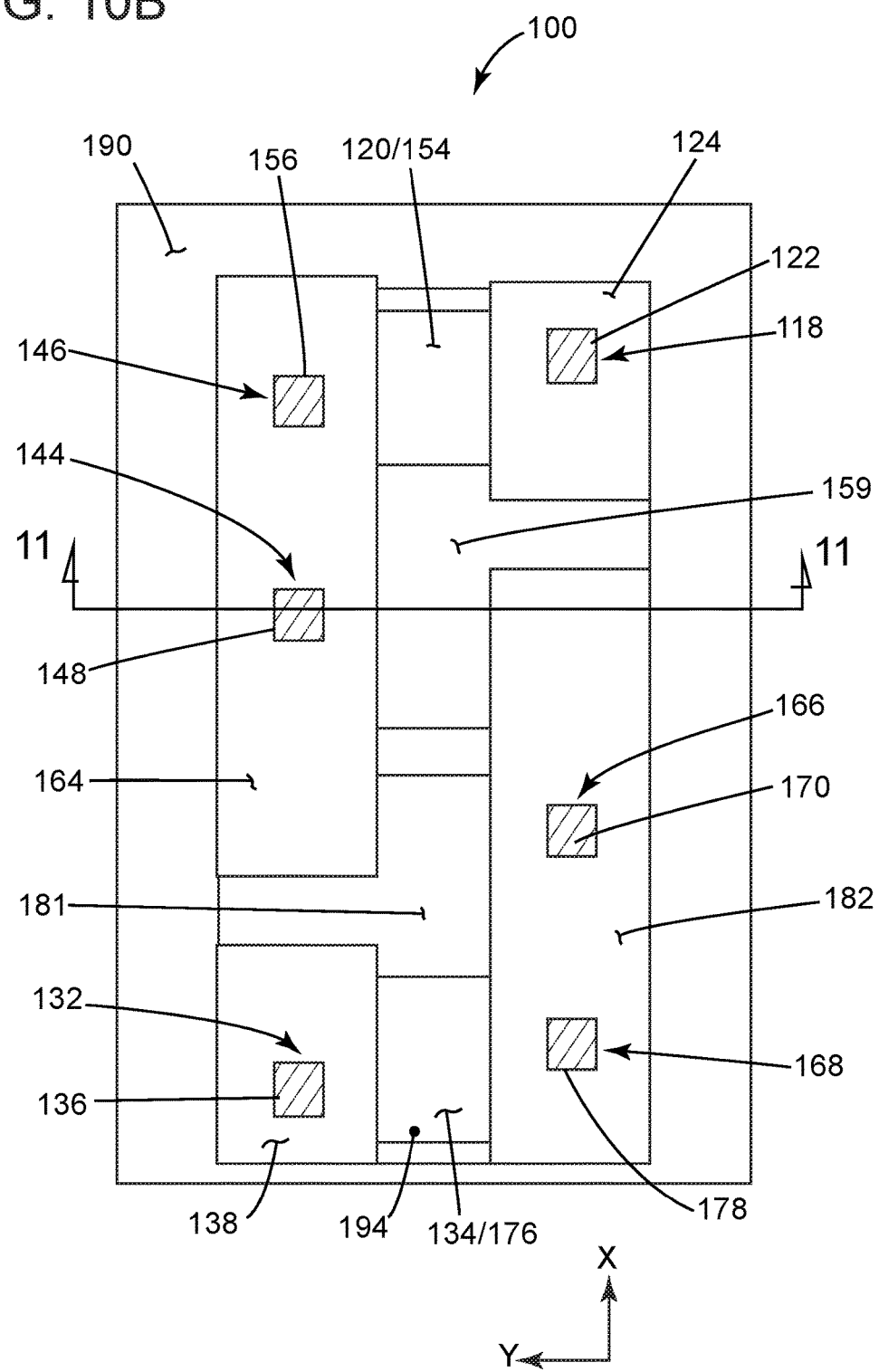
FIG. 10B is an exemplary embodiment of a top view of the vertical SRAM cell structure of FIG. 10A in accordance with the present invention.

Referring to FIGS. 10A and 10B, a perspective/right-side view and a top view are shown respectively of the vertical SRAM cell after the gate structures and upper S/D regions have been formed. Next, the gate structures 124, 138, for the 1$^{st}$ and 2$^{nd}$ PG transistors 118, 132, the 1$^{st}$ common gate structure 164 for the 1$^{st}$ PU and PD transistors 144, 146, as well as the 2$^{nd}$ common gate structure 182 for the 2$^{nd}$ PU and PD transistors 166, 168 are formed on the channels 126, 140, 152, 158, 174, 180 of those transistors. The gate structures may be formed by one or more well-known methods.

The gate structures include gate metal and gate spacers. The gate spacers (not shown) are composed of a dielectric material such as SiN, SiNC, SiBCN or similar. The gate metal is typically a stack of gate metals, which generally includes three main groups of structures (not shown). Those three main structures are: the gate dielectric layers (typically a high-k dielectric material), the work-function metal structures (typically TiN, TaN, TiCAl, other metal-nitrides or similar materials) and the gate electrode metal (typically Al, W, Cu or similar metal). The gate dielectric layers are used to electrically insulate the work-function metal structures and the gate electrodes from the substrate. The work-function metal structures are generally metal-nitrides that provide the work-function needed for proper transistor operation, but typically have 10 to 100 times larger resistivity than the gate electrodes. The gate electrodes are metals, such as tungsten, with a very low resistivity.

As discussed earlier herein, the gate spacers of the gate structures have not been illustrated in order to more clearly shown the channels 126, 140, 152, 158, 174, 180 of the transistors. With the gate spacers removed, it can be seen that the channels extend vertically from the bottom S/D regions and through the gate structures.

Disposed at the upper end of the channels are the upper S/D regions 122, 136, 148, 156, 170 and 178. The upper S/D regions may be epitaxially grown on the upper ends of the channels of those transistors.

Figure 11:
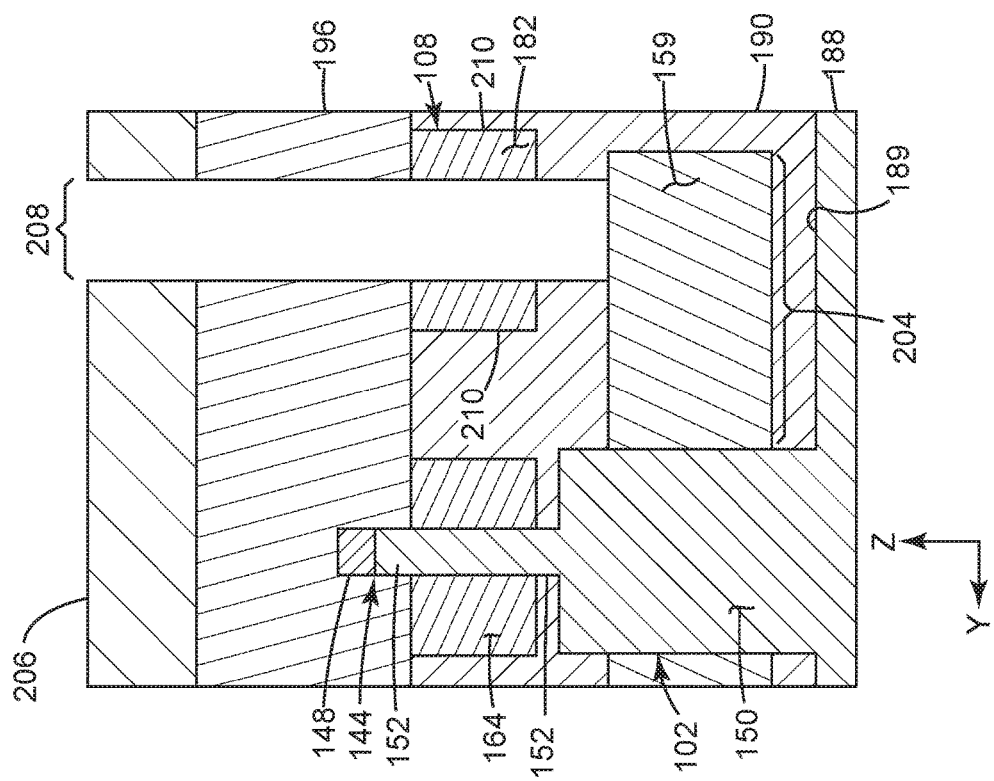
FIG. 11 is a cross-sectional view of an exemplary embodiment of the vertical SRAM cell structure of FIG. 10B taken along the line 11-11 of FIG. 10B in accordance with the present invention.

Referring to FIG. 11, a cross-sectional view of FIG. 10B taken along the line 11-11 of FIG. 10B is presented. In the embodiment illustrated in FIG. 11, and in the embodiments illustrated in FIGS. 12-22, the thickness of the FOX layer 190 has been increased by further deposition of flowable oxide material earlier in the process flow. The FOX layer 190 now covers the structure 100 up to at least a height of the metal gate structures 124, 138, 164, 182 above the substrate layer 188. Additionally, the well-known gate spacers of the metal gate structures are not shown for purposes of clarity.

Additional the dielectric layer 196 has also been disposed over the entire vertical SRAM cell structure 100 and polished down so that it is substantially level. The dielectric layer 196 may also be a flowable oxide layer similar in composition to that of FOX layer 190.

FIG. 11 shows the cross-sectional view of the 1$^{st}$ PU transistor 144 and 1$^{st}$ metal contact 159 of the 1$^{st}$ inverter 102 on the left side of structure 100. The 1$^{st}$ metal contact 159 includes a 1$^{st}$ cross-coupled extension 204. The 1$^{st}$ cross-coupled extension 204 extends along the substrate plane 189 in both the X and Y directions such that it is disposed directly under the 2$^{nd}$ common gate structure 182 of the 2$^{nd}$ inverter 108.

As will be discussed in greater detail herein, the 1$^{st}$ cross-coupled contact 184 will be formed in electrical contact with the 1$^{st}$ cross-coupled extension 204 and the 2$^{nd}$ common gate structure 182 to provide electrical continuity between the 1$^{st}$ metal contact 159 and the 2nd common gate structure 182. The process flow of how the 1$^{st}$ and 2$^{nd}$ cross-coupled contacts 184, 186 are formed is substantially the same and is detailed in the following figures.

Figure 12:
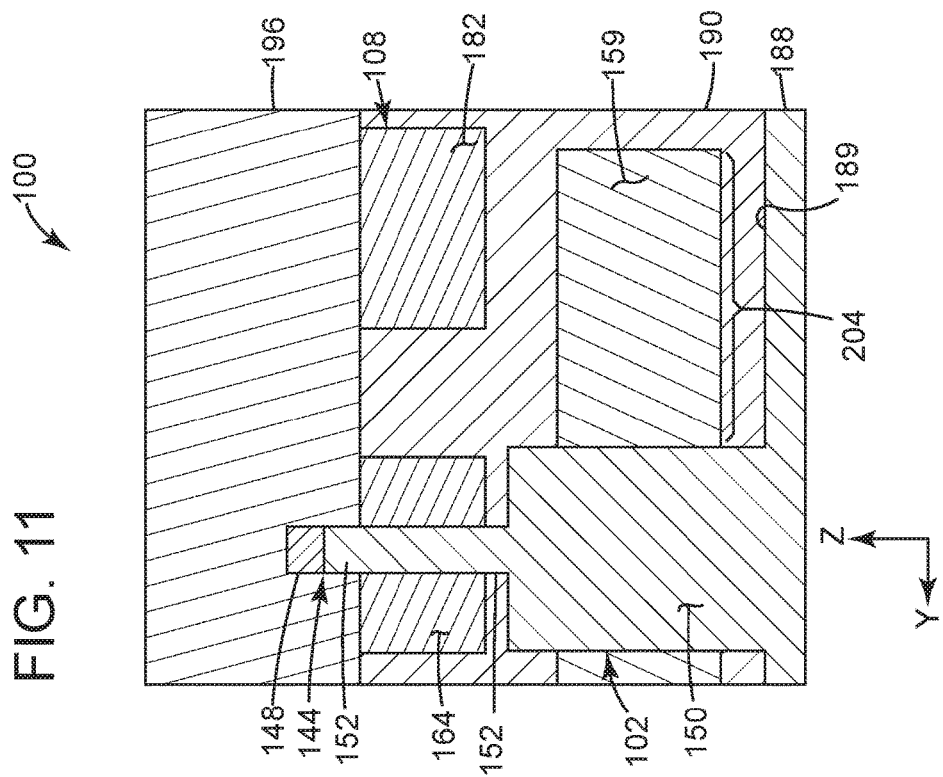
FIG. 12 is a cross-sectional view of an exemplary embodiment of the vertical SRAM cell structure of FIG. 11 having a 1st litho stack disposed thereon and a cross-coupled trench penetrating the gate structure in accordance with the present invention.

Referring to FIG. 12, next a 1$^{st}$ lithographic stack 206 is disposed over the SRAM cell structure 100. The 1$^{st}$ lithographic stack (or litho stack) 206 may be composed of several different kinds of layers, depending on such parameters as the application requirements, design or proprietary preferences or the like. In this embodiment, the litho stack 206 includes at least a top resist layer (not shown) and a bottom spin-on hardmask (SOH) layer (not shown).

Next the $1^{st}$ litho stack 206 is patterned and then anisotropically etched to form a $1^{st}$ cross-coupled trench 208. The anisotropic etching process can be done by a reactive ion etching (RIE) process or similar.

The RIE etching process must be selective enough to anisotropically etch away the dielectric layer 196, the gate structure 182 and FOX layer 190 without significantly etching the $1^{st}$ metal contact 159. The $1^{st}$ cross-coupled trench 208 is targeted to penetrate the 2nd common gate structure 182 and land on the top surface of the $1^{st}$ metal contact 159.

More specifically, in this embodiment, the $1^{st}$ cross-coupled trench 208 penetrates an inner portion of the gate structure 182 without extending over any sidewalls 210 of the gate structure 182. Accordingly, the entire perimeter of the $1^{st}$ cross-coupled trench 208 is surrounded by the $2^{nd}$ common gate structure 182. Additionally, the $1^{st}$ cross-coupled trench 208 exposes a top surface of the $1^{st}$ cross-coupled extension 204 of $1^{st}$ metal contact 159.

Figure 13:
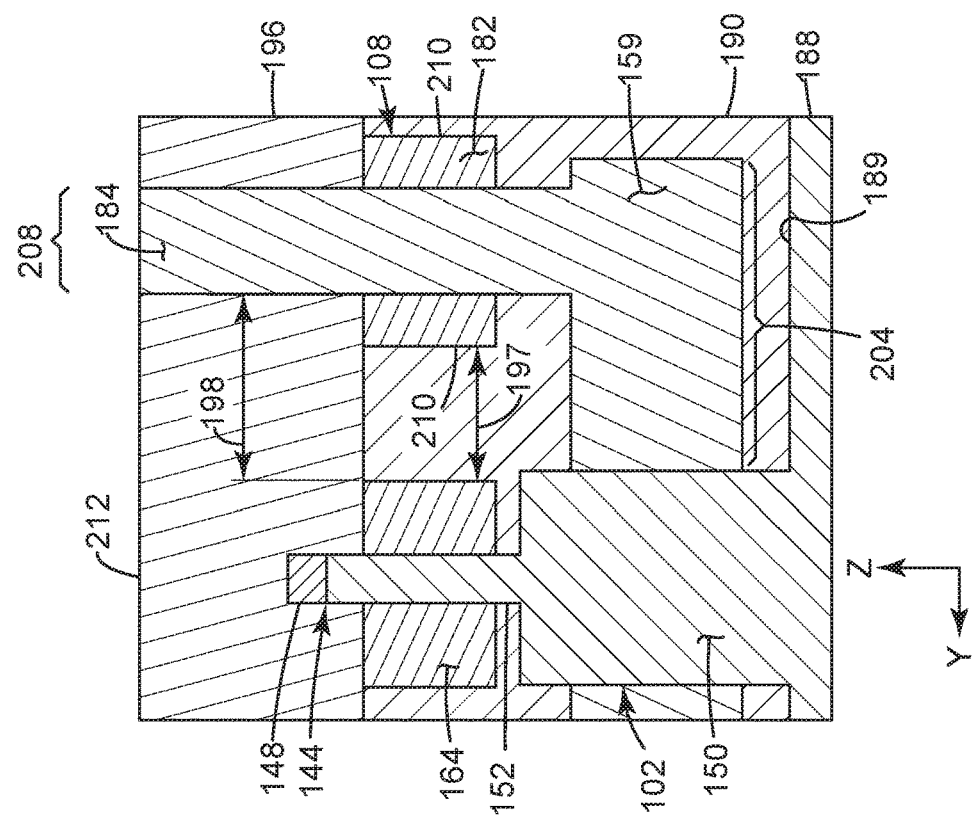
FIG. 13 is a cross-sectional view of an exemplary embodiment of the vertical SRAM cell structure of FIG. 12 having the 1st litho stack removed in accordance with the present invention.

Referring to FIG. 13, next the $1^{st}$ litho stack 206 is removed. This may be accomplished by wet etching or similar.

Figure 14:
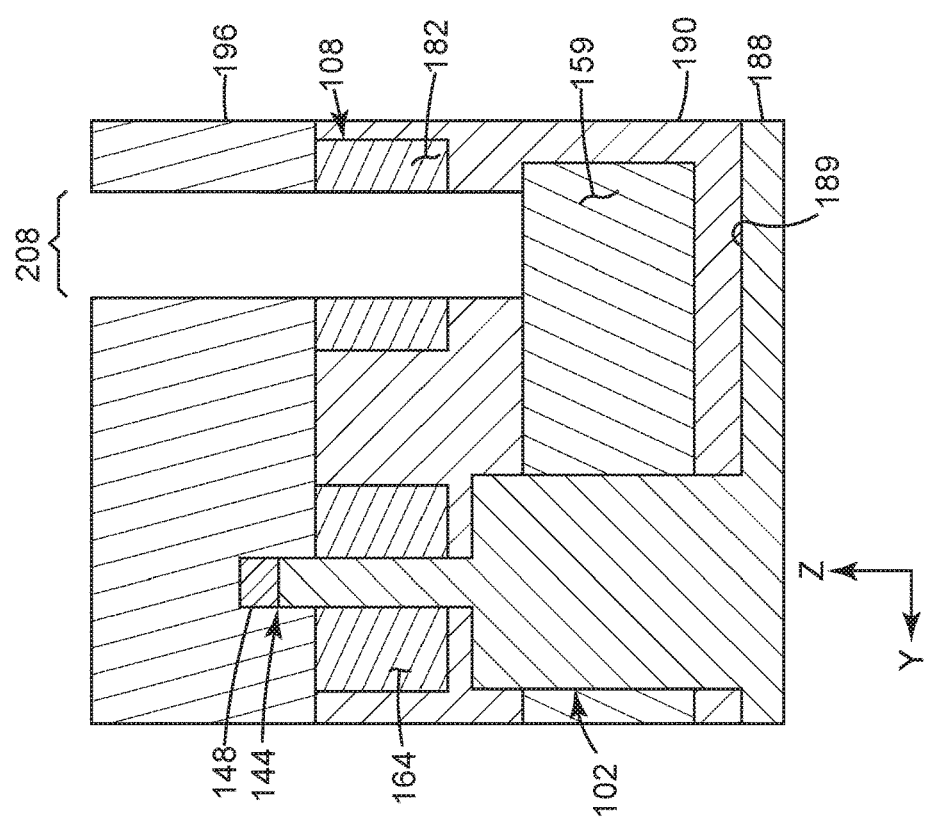
FIG. 14 is a cross-sectional view of an exemplary embodiment of the vertical SRAM cell structure of FIG. 13 having a cross-coupled contact disposed in the cross-coupled trench in accordance with the present invention.

Referring to FIG. 14, next the $1^{st}$ cross-coupled contact 184 is deposited into the $1^{st}$ cross-coupled trench 208. This can be done by first disposing a metal layer over the entire structure 100 and then polishing the metal layer down to a top surface 212 of the dielectric layer 196. This can be done utilizing a chemical-mechanical polishing (CMP) process or similar.

The $1^{st}$ cross-coupled contact 184 lands on the $1^{st}$ cross-coupled extension 204 of the $1^{st}$ metal contact 159. The $1^{st}$ cross-coupled contact 184 advantageously penetrates only an inner portion of the $2^{nd}$ common gates structure 182. Moreover, the entire perimeter of the $1^{st}$ cross-coupled contact 184 is surrounded by the $2^{nd}$ common gate structure 182. The $1^{st}$ cross-coupled contact 184 does not extend over any vertical sidewalls 210 of the gate structure 182 to interfere with the gate pitch 197.

Additionally it is important to note that, just as illustrated in FIG. 6A with reference to the $2^{nd}$ cross-coupled contact 186, the minimum separation distance 198 between edges of the of the $1^{st}$ cross-coupled contact 184 and the edges of the adjacent common gate structure 164 is at least as large as the minimum pitch distance 197 between the $1^{st}$ and $2^{nd}$ common gate structures 164, 182. In other words, the minimum separation distance 198 is advantageously greater than or equal to the minimum pitch distance 197.

This completes the formation of the $1^{st}$ cross-coupled contact 184. The formation of the $2^{nd}$ cross-coupled contact 186 is done utilizing substantially the same method.

Figure 15:
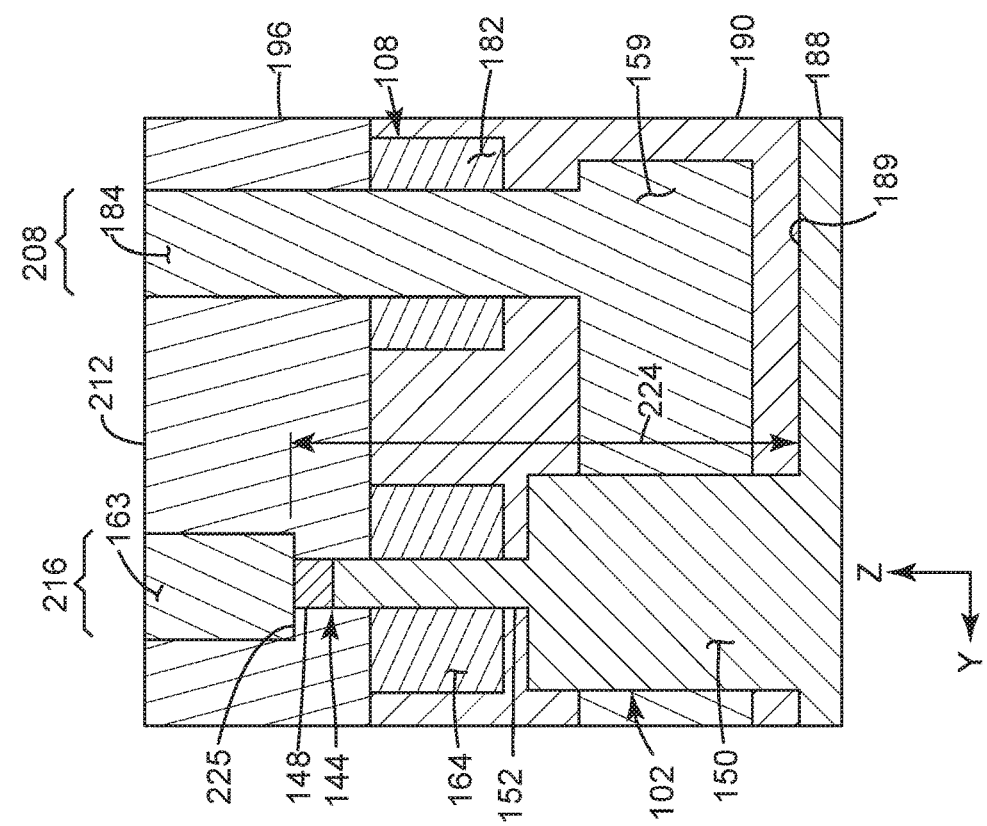
FIG. 15 is a cross-sectional view of an exemplary embodiment of the vertical SRAM cell structure of FIG. 14 having a 2nd litho stack disposed thereon and an upper S/D region trench disposed into the SRAM cells structure in accordance with the present invention.

Referring to FIG. 15, next a $2^{nd}$ litho stack 214 is disposed over the vertical SRAM cell structure 100. Upper S/D region trenchers 216 are patterned and anisotropically etched into the litho stack 234 and dielectric layer 196. The trenches are disposed directly over the upper S/D regions 122, 136, 148, 156, 170, 178 of the transistors in the vertical SRAM cell 100. In this particular example, the trench 216 is disposed directly over, and exposes, the upper S/D region 148 of the $1^{st}$ PU transistor 144.

The method of forming CA contacts 163 (such as the contacts for the bit line 128 bit line bar 142, voltage supply 160 and voltage ground 162) to the upper S/D regions 122, 136, 148, 156, 170, 178 is substantially the same. Therefore, only the method of formation of the CA contact 163 for the voltage supply (Vdd) 160 to the upper S/D region 148 of the $1^{st}$ PU transistor 144 will be illustrated.

Referring to FIG. 16, the $2^{nd}$ litho stack 214 is next removed. This can be done by a wet etch process or similar.

Next the CA contact 163 for the voltage supply 160 is deposited into the upper S/D region trench 216. This can be done by first disposing a metal layer over the entire structure 100 and then polishing the metal layer down to the top surface 212 of the dielectric layer 196. This can be done utilizing a chemical-mechanical polishing (CMP) process or similar.

This completes the formation of the CA contact 163 for the voltage supply 160. The formation of the CA contacts 163 for the bit line 128, bit line bar 142 and voltage ground 162 are done utilizing substantially the same method.

Figure 17:
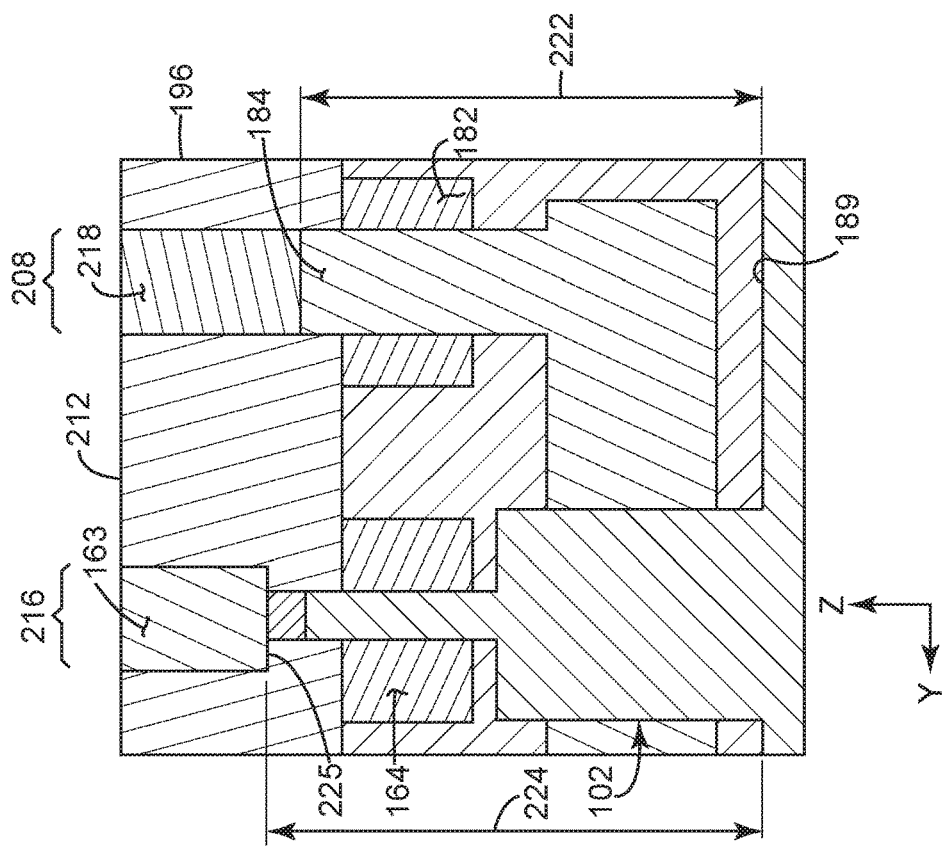
FIG. 17 is a cross-sectional view of an alternative exemplary embodiment of the vertical SRAM cell structure of FIG. 16 at an intermediate stage of manufacture having a cross-coupled contact recessed into the cross-coupled trench to a height that is above a height of a top surface of the gate structures in accordance with the present invention.

Referring to FIG. 17, a method of making recessed cross-coupled contacts 184, 186, which are buried by a dielectric plug 218 (best seen in FIG. 18) is presented. The method proceeds in substantially the same steps as shown in FIGS. 8-14. However, once the cross-coupled contact 184 has been formed up to the level of the top surface 212 of the dielectric layer 196, an upper surface 220 of the cross-coupled contact 184 is recessed within its cross-coupled trench 208 to a predetermined recessed height 222 as shown in FIG. 17. The recessing may be done by a selective RIE etch process or similar.

The recessed height 222 of the upper surface 220 is set below a lower surface height 224 of a lower surface 225 the CA contact 163 (best seen in FIG. 18). By setting the recessed upper surface height 222 of cross-coupled contact 184 below the lower surface height 224, the possibility of unwanted electrical shorts between the cross-coupled contact 184 and CA contact 163 is greatly reduced.

Figure 18:
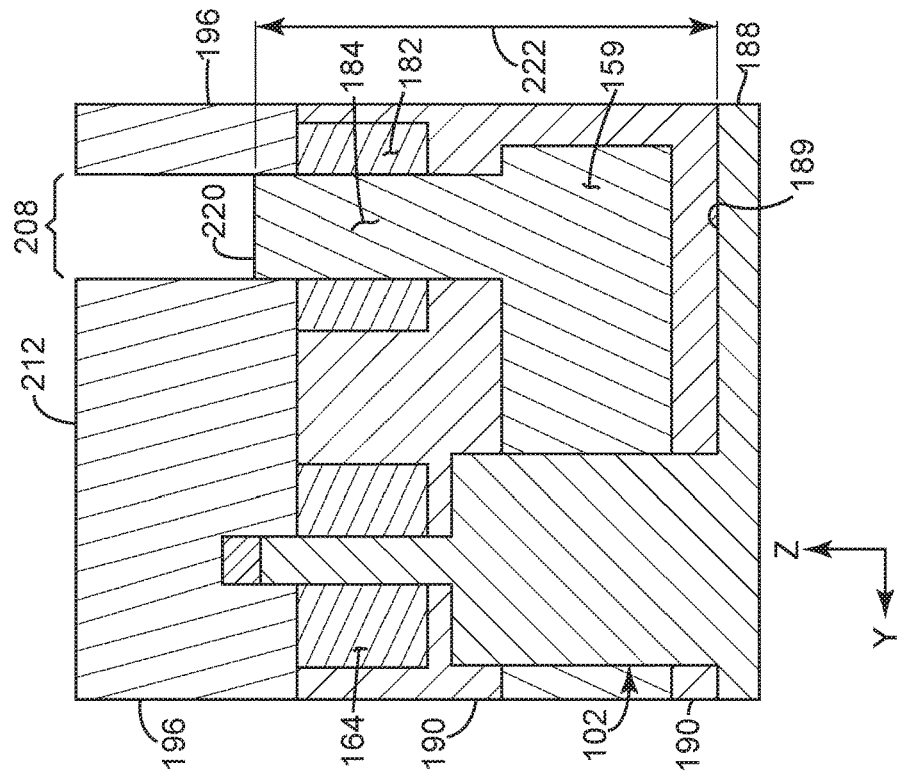
FIG. 18 is a cross-sectional view of an exemplary embodiment of the vertical SRAM cell structure of FIG. 17 having a dielectric plug disposed in the cross-coupled trench over the cross-coupled contact in accordance with the present invention.

Referring to FIG. 18, next the dielectric plug 218 is deposited within the trench 208 and over the cross-coupled contact 184. This can be done by first disposing a low-k dielectric layer over the entire structure 100 and then polishing the low-k dielectric layer down to the top surface 212 of the dielectric layer 196 to form the dielectric plug 218. This can be done utilizing a chemical-mechanical polishing (CMP) process or similar.

The process then follows substantially the same steps illustrated in FIGS. 15-16 to complete the formation of the CA contacts 163. Since the lower surface height 224 of CA contact 163 is greater than the upper surface height 222 of cross-coupled contact 184, there is a reduced chance of the CA contact 163 and cross-coupled contact 184 electrically shorting together.

Referring to FIG. 19 another alternative vertical SRAM cell structure 100 having a buried cross-coupled contact and method of making the same is presented. In this method, the upper surface 220 is recessed to its predetermined recessed height 222 as illustrated earlier. However the recessed height 222 is below an upper surface height 226 of an upper surface 230 of the common gate structure 182 and above a lower surface height 228 of a lower surface 232 of the common gate structure 182.

Referring to FIG. 20, the dielectric plug 218 is then deposited as before within the trench 208 to bury the cross-coupled contact 184. Essentially, the cross-coupled contact 184 is recessed within the $2^{nd}$ common gate structure. As long as the cross-coupled contact 184 is not recessed below the height 228 of the lower surface 232 of the common gate structure, the cross-coupled contact 184 can still function properly. This structure further reduces the possibility of an electrical short occurring between the cross-coupled contact 184 and the CA contact 163.

Referring to FIGS. 21-22, another alternative vertical SRAM cell structure 100 having a buried cross-coupled contact and method of making the same is presented. The buried cross-coupled contact illustrated is the $1^{st}$ cross-coupled contact 184. However the alternative structure and method applies to the $2^{nd}$ cross-coupled contact 186 as well.

Referring to FIG. 21, the upper surface 220 of the cross-coupled contact 184 is recess within its cross-coupled trench 208 to the upper surface height 222 in the same manner illustrated in FIG. 17. The exposed upper surface 220 of the cross-coupled contact 184 and the cross-coupled trench have a $1^{st}$ width 234.

The trench 208 is then widened to a $2^{nd}$ width 236. The $2^{nd}$ width 236 is larger than the $1^{st}$ width 234. The trench 208 may be widened by lithographically patterning and anisotropically etching the trench 208.

Referring to FIG. 22, next the dielectric plug 218 is deposited within the trench 208 and over the cross-coupled contact 184. The plug 218, in this embodiment, is disposed over the top surface 220 of the cross-coupled contact 184 and has a width that is equal to the $2^{nd}$ width 236.

The CA contact 163 is then disposed over the upper S/D region 148 of the $1^{st}$ PU transistor 144. The process of disposing the CA contacts 163 follows substantially the same steps illustrated in FIGS. 15-16.

However, because of the $2^{nd}$ width 236 of the plug 218 is larger than the $1^{st}$ width 234 of the cross-coupled contact 184, the CA contacts 163 can be formed to self-align with sidewalls 238 of the plug 218. This self-alignment virtually prevents contact between the CA contacts 163 and the cross-coupled contacts 184, 186. Therefore, the larger plug width 236 greatly reduces the possibility of an electrical short between the CA contacts 163 and the cross-coupled contacts 184, 186.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A vertical SRAM cell comprising:
   a first ($1^{st}$) inverter having a $1^{st}$ common gate structure operatively connecting channels of a $1^{st}$ pull-up (PU) and a $1^{st}$ pull-down (PD) transistor, and a $1^{st}$ metal contact electrically connecting bottom source/drain (S/D) regions of the $1^{st}$ PU and $1^{st}$ PD transistors;
   a second ($2^{nd}$) inverter having a $2^{nd}$ common gate structure operatively connecting channels of a $2^{nd}$ PU and a $2^{nd}$ PD transistor, and a $2^{nd}$ metal contact electrically connecting bottom S/D regions of the $2^{nd}$ PU and $2^{nd}$ PD transistors;
   a $1^{st}$ cross-coupled contact electrically connecting the $2^{nd}$ common gate structure to the $1^{st}$ metal contact, the $2^{nd}$ common gate structure entirely surrounding a perimeter of the $1^{st}$ cross-coupled contact; and
   a $2^{nd}$ cross-coupled contact electrically connecting the $1^{st}$ common gate structure to the $2^{nd}$ metal contact, the $1^{st}$ common gate structure entirely surrounding a perimeter of the $2^{nd}$ cross-coupled contact.

2. The vertical SRAM cell of claim 1 comprising:
   the $1^{st}$ cross-coupled contact penetrating the $2^{nd}$ common gate structure such that the $1^{st}$ cross-coupled contact does not extend between edges of the $1^{st}$ and $2^{nd}$ common gate structures; and
   the $2^{nd}$ cross-coupled contact penetrating the $1^{st}$ common gate structure such that the $2^{nd}$ cross-coupled contact does not extend between edges of the $1^{st}$ and $2^{nd}$ common gate structures.

3. The vertical SRAM cell of claim 1 comprising:
   the $1^{st}$ and $2^{nd}$ common gate structures having a minimum pitch distance; and
   the $1^{st}$ and $2^{nd}$ cross-coupled contacts having a minimum separation distance between edges of the cross-coupled contacts and edges of adjacent gate structures;
   wherein the minimum separation distance is greater than or equal to the minimum pitch distance.

4. The vertical SRAM cell of claim 1 comprising:
   the $1^{st}$ metal contact disposed on sidewalls, and not on a top surface, of the bottom S/D regions of the $1^{st}$ PU and $1^{st}$ PD transistors; and
   the $2^{nd}$ metal contact disposed on sidewalls, and not on a top surface, of the bottom S/D regions of the $2^{nd}$ PU and $2^{nd}$ PD transistors.

5. The vertical SRAM cell of claim 1 comprising:
   the bottom S/D regions of the $1^{st}$ PU, $1^{st}$ PD, $2^{nd}$ PU and $2^{nd}$ PD transistors being disposed on a substrate,
   the channels of the $1^{st}$ PU, $1^{st}$ PD, $2^{nd}$ PU and $2^{nd}$ PD transistors extending upwards from a top surface of the bottom S/D regions,
   the $1^{st}$ common gate structure disposed above the bottom S/D regions of the $1^{st}$ PU and the $1^{st}$ PD transistors; and
   the $2^{nd}$ common gate structure disposed above the bottom S/D regions of the $2^{nd}$ PU and $2^{nd}$ PD transistors.

6. The vertical SRAM cell of claim 5 comprising:
   each of the $1^{st}$ PU, $1^{st}$ PD, $2^{nd}$ PU and $2^{nd}$ PD transistors having:
     an upper S/D region disposed on an upper end of each channel, and
     a CA contact disposed on the upper S/D region, the CA contacts each having a lower surface disposed at a lower surface height above the substrate; and
   an upper surface of each of the cross-coupled contacts disposed at a recessed height above the substrate;
   wherein the lower surface height of the lower surface of the CA contacts is above a level of the recessed height of the upper surface of the cross-coupled contacts.

7. The vertical SRAM cell of claim 6 comprising:
   each of the upper surfaces of the cross-coupled contacts having a $1^{st}$ width; and
   a dielectric plug disposed over each of the upper surfaces of the cross-coupled contacts, each dielectric plug having a $2^{nd}$ width;
   wherein the $2^{nd}$ width is larger than the $1^{st}$ width.

8. The vertical SRAM cell of claim 7 comprising:
   each dielectric plug having sidewalls; and
   each CA contact being self-aligned with at least one sidewall of the dielectric plugs.

9. The vertical SRAM cell of claim 6 comprising:
   the $1^{st}$ and $2^{nd}$ common gate structures having an upper surface at an upper surface height and a lower surface at a lower surface height;
   wherein the recessed height of the upper surface of the cross-coupled contacts is above the lower surface height of the lower surface of the common gate structures; and
   wherein the recessed height of the upper surface of the cross-coupled contacts is below the upper surface height of the upper surface of the common gate structures.

10. The vertical SRAM cell of claim 5 comprising:

the $1^{st}$ metal contact, the $1^{st}$ cross-coupled contact, the bottom S/D region of the $1^{st}$ PU transistor, the bottom S/D region of the $1^{st}$ PD transistor and the $2^{nd}$ common gate structure being electrically connected to form a $1^{st}$ storage node; and the $2^{nd}$ metal contact, the $2^{nd}$ cross-coupled contact, the bottom S/D region of the $2^{nd}$ PU transistor, the bottom S/D region of the $2^{nd}$ PD transistor and the $1^{st}$ common gate structure being electrically connected to form a $2^{nd}$ storage node.

11. The vertical SRAM cell of claim 10 comprising:

a $1^{st}$ pass-gate (PG) transistor having a bottom S/D region disposed on the substrate and a channel extending upwards from a top surface of the bottom S/D region;

a $2^{nd}$ PG transistor having a bottom S/D region disposed on the substrate and a channel extending vertically upwards from a top surface of the bottom S/D region;

wherein the bottom S/D region of the $1^{st}$ PG transistor is in electric contact with the Pt storage node; and wherein the bottom S/D region of the $2^{nd}$ PG transistor is in electric contact with the $2^{nd}$ storage node.

12. The vertical SRAM cell of claim 11 comprising:

the bottom S/D regions of the $1^{st}$ PG and $1^{st}$ PD transistors being a single $1^{st}$ common bottom S/D region; and the bottom S/D region of the $2^{nd}$ PG and $2^{nd}$ PD transistors being a single $2^{nd}$ common bottom S/D region.

13. The vertical SRAM cell of claim 11 comprising the channels of the $1^{st}$ PU, $1^{st}$ PD, $1^{st}$ PG, $2^{nd}$ PU, $2^{nd}$ PD and $2^{nd}$ PG transistors being one of a fin and a nanowire.

14. The vertical SRAM cell of claim 11 comprising:

the $1^{st}$ PU and $2^{nd}$ PU transistors being a p-type transistor;

the $1^{st}$ PD and $2^{nd}$ PD transistors being an n-type transistor; and the $1^{st}$ PG and $2^{nd}$ PG transistors being an n-type transistor.

15. The vertical SRAM cell of claim 1 comprising:

the $1^{st}$ cross-coupled contact being disposed on at least one of the $1^{st}$ metal contact, the bottom S/D region of the $1^{st}$ PU transistor and the bottom S/D region of the $1^{st}$ PD transistor; and the $2^{nd}$ cross-coupled contact being disposed on at least one of the $2^{nd}$ metal contact, the bottom S/D region of the $2^{nd}$ PU transistor and the bottom S/D region of the $2^{nd}$ PD transistor.

* * * * *